(12) United States Patent
Kim

(10) Patent No.: US 12,031,224 B2
(45) Date of Patent: Jul. 9, 2024

(54) MASK HAVING A PLATING LAYER AND METHOD OF MANUFACTURING THE SAME

(71) Applicant: LG Display Co., Ltd., Seoul (KR)

(72) Inventor: Hyunjun Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/184,640

(22) Filed: Mar. 15, 2023

(65) Prior Publication Data

US 2023/0212772 A1    Jul. 6, 2023

Related U.S. Application Data

(62) Division of application No. 16/573,263, filed on Sep. 17, 2019, now Pat. No. 11,629,421.

(30) Foreign Application Priority Data

Dec. 31, 2018    (KR) .................. 10-2018-0173975

(51) Int. Cl.
| | | |
|---|---|---|
| C25D 1/10 | (2006.01) | |
| C23C 14/04 | (2006.01) | |
| C23C 14/34 | (2006.01) | |
| C23C 28/02 | (2006.01) | |
| H10K 71/00 | (2023.01) | |
| H10K 71/16 | (2023.01) | |

(52) U.S. Cl.
CPC .............. *C25D 1/10* (2013.01); *C23C 14/042* (2013.01); *C23C 14/34* (2013.01); *C23C 28/02* (2013.01); *H10K 71/00* (2023.02); *H10K 71/166* (2023.02)

(58) Field of Classification Search
CPC . C25D 1/10; C25D 5/022; C25D 5/10; C25D 7/00; C23C 14/042; C23C 14/34; C23C 28/02; C23C 18/1657; H10K 71/00; H10K 71/166; H10K 71/10; H10K 71/233; G03F 7/2063
See application file for complete search history.

(56) References Cited

U.S. PATENT DOCUMENTS

| | | | |
|---|---|---|---|
| 8,656,859 B2 | 2/2014 | Hong et al. | |
| 8,881,676 B2 * | 11/2014 | Hong ..................... | H10K 71/00 |
| | | | 118/504 |
| 8,915,213 B2 * | 12/2014 | Park ...................... | C23C 14/042 |
| | | | 118/721 |
| 9,346,078 B2 * | 5/2016 | Oh ........................ | B05C 21/005 |
| 9,567,662 B2 * | 2/2017 | Kim ...................... | C23C 14/042 |
| 9,711,724 B2 * | 7/2017 | Baek ..................... | C23C 14/042 |

(Continued)

FOREIGN PATENT DOCUMENTS

| | | |
|---|---|---|
| CN | 102201550 A | 9/2011 |
| CN | 102899608 A | 1/2013 |

(Continued)

*Primary Examiner* — Caleb E Henry
(74) *Attorney, Agent, or Firm* — Seed IP Law Group LLP

(57) ABSTRACT

A mask and a method of manufacturing the same are disclosed. The method of manufacturing a mask includes forming a conductive layer on a pattern region and an auxiliary region around the pattern region of a substrate, placing the substrate including the conductive layer in a plating bath, forming a plating layer on the conductive layer, and separating the substrate and the conductive layer from the plating layer.

18 Claims, 23 Drawing Sheets

(56) References Cited

U.S. PATENT DOCUMENTS

| | | | |
|---|---|---|---|
| 10,128,440 B2* | 11/2018 | Lee | H10K 71/00 |
| 10,287,669 B2* | 5/2019 | Chun | B23K 26/389 |
| 10,301,715 B2* | 5/2019 | Yoo | B23K 26/24 |
| 10,396,282 B2* | 8/2019 | Lee | H10K 71/166 |
| 10,790,447 B2* | 9/2020 | Moon | C23C 14/042 |
| 11,326,258 B2 | 5/2022 | Yoo et al. | |
| 2001/0042637 A1* | 11/2001 | Hirose | H05K 3/0038 |
| | | | 174/255 |
| 2004/0020435 A1* | 2/2004 | Tsuchiya | C23C 14/042 |
| | | | 118/723 VE |
| 2006/0046455 A1* | 3/2006 | Nitta | C25D 5/022 |
| | | | 438/597 |
| 2007/0035466 A1* | 2/2007 | Coleman | G06K 19/07752 |
| | | | 343/702 |
| 2009/0294297 A1* | 12/2009 | Kim | C25D 5/12 |
| | | | 205/183 |
| 2010/0267227 A1 | 10/2010 | Ko et al. | |
| 2011/0229633 A1* | 9/2011 | Hong | H10K 71/166 |
| | | | 118/504 |
| 2012/0266813 A1* | 10/2012 | Hong | H10K 71/00 |
| | | | 118/504 |
| 2013/0327564 A1 | 12/2013 | Yu et al. | |
| 2014/0144674 A1* | 5/2014 | Sarraf | H05K 1/0296 |
| | | | 174/250 |
| 2014/0150721 A1* | 6/2014 | Oh | C23C 14/042 |
| | | | 118/504 |
| 2014/0291306 A1* | 10/2014 | Lee | B23K 26/40 |
| | | | 219/121.72 |
| 2014/0326177 A1* | 11/2014 | Lee | C25D 3/562 |
| | | | 118/504 |
| 2015/0027367 A1* | 1/2015 | Hong | C23C 14/04 |
| | | | 118/505 |
| 2016/0026089 A1* | 1/2016 | Chen | C23C 14/042 |
| | | | 118/504 |
| 2016/0212857 A1* | 7/2016 | Miyoshi | C25D 7/0614 |
| 2018/0148823 A1* | 5/2018 | Yoo | B23K 26/24 |
| 2018/0148844 A1* | 5/2018 | Yoo | B23K 26/28 |
| 2019/0368025 A1* | 12/2019 | Kim | G03F 7/2063 |
| 2019/0378984 A1 | 12/2019 | Nakamura et al. | |
| 2020/0208284 A1* | 7/2020 | Kim | C23C 18/1657 |

FOREIGN PATENT DOCUMENTS

| | | |
|---|---|---|
| CN | 107424909 A | 12/2017 |
| CN | 107541699 A | 1/2018 |
| CN | 108118289 A | 6/2018 |
| CN | 108118290 A | 6/2018 |
| CN | 108220885 A | 6/2018 |
| KR | 20100114685 A | 10/2010 |
| KR | 20140106987 A | 9/2014 |
| KR | 20180047594 A | 5/2018 |
| KR | 20180062486 A | 6/2018 |
| KR | 20180071036 A | 6/2018 |

* cited by examiner

MASK HAVING A PLATING LAYER AND METHOD OF MANUFACTURING THE SAME

CROSS-REFERENCE TO RELATED APPLICATION(S)

This application is a Divisional application of Ser. No. 16/573,263 filed on Sep. 17, 2019, which claims the benefit and priority to Korean Patent Application No. 10-2018-0173975, filed on Dec. 31, 2018, the entirety of which is hereby incorporated by reference.

BACKGROUND

Technical Field

The present disclosure relates to a mask and a method of manufacturing the same.

Description of the Related Art

Among display apparatuses, electroluminescent display apparatuses are self-emitting display apparatuses and have excellent viewing angle and contrast ratio. Since the electroluminescent display apparatuses do not need a separate backlight, they can be made lighter and thinner with excellent power consumption. For example, an organic light emitting display apparatus among the electroluminescent display apparatuses is driven with a low direct current (DC) voltage, has a fast response time, and is low in manufacturing cost.

The electroluminescent display apparatus may include a plurality of electroluminescent diodes. The electroluminescent diode may include an anode electrode, an emission layer formed on the anode electrode, and a cathode electrode formed on the emission layer. When a high-potential voltage and a low-potential voltage are applied to the anode electrode and the cathode electrode, respectively, each of a hole from the anode electrode and an electron from the cathode electrode is transported into the emission layer. When the hole and the electron are combined in the emission layer, an exciton is generated during excitation and light is generated with energy from the exciton. The electroluminescent display apparatus can display images by electrically controlling the amount of light generated from emission layers of the plurality of electroluminescent diodes.

The electroluminescent display apparatus may include a light emitting element including red, green, and blue emission layers to display a full-color image. An organic layer of the electroluminescent display apparatus may have a patterned emission layer structure. In the electroluminescent display apparatus having the patterned emission layer structure, emission layers emitting light of different colors are separated for respective pixels.

For example, a red organic emission layer for emitting red light, a green organic emission layer for emitting green light, and a blue organic emission layer for emitting blue light may be separated in a red sub-pixel, a green sub-pixel, and a blue sub-pixel, respectively. The organic emission layers may be deposited and patterned on emission regions of the respective sub-pixels using a mask, e.g., a fine metal mask (FMM), having openings for the respective sub-pixels.

BRIEF SUMMARY

Such a mask has been typically manufactured by forming a pattern through an exposure and development process and then transferring the pattern on a metal sheet through wet-etching. However, when the mask is manufactured using the wet-etching process, it is difficult to precisely control the pattern width during the etching process due to the isotropy of etching. Therefore, it is difficult to obtain a high-resolution pattern.

Accordingly, the inventor of the present disclosure developed a process for manufacturing a mask, e.g., FMM, for use in a manufacturing process of the electroluminescent display apparatus by electroplating. In the electroplating process, a plating layer is formed on a seed pattern disposed on a substrate by applying a current to the seed pattern.

The inventor of the present disclosure recognized that the mask manufactured by electroplating has a difference in thickness of the plating layer depending on the position of the seed pattern due to a difference in current density or the like.

Accordingly, the inventor of the present disclosure invented a mask in which the thickness of a plating layer may be maintained uniformly according to the position of a conductive layer which is the seed pattern, through various experiments.

An object of the present disclosure is to provide a mask in which the thickness of a plating layer may be uniformly maintained by uniformly maintaining the thickness of a conductive layer as a seed pattern.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a method of manufacturing a mask including forming a conductive layer on a pattern region and an auxiliary region around the pattern region of a substrate. The method further includes placing the substrate including the conductive layer in a plating bath. The method also includes forming a plating layer on the conductive layer and separating the substrate and the conductive layer from the plating layer.

In another aspect, there is provided a mask including a pattern region in a plurality of cell regions, the pattern region having a first plating layer. The mask further includes an auxiliary region configured to be around the pattern region, the auxiliary region having a second plating layer.

In another aspect, a mask includes a substrate including a plurality of cell regions. The mask further includes a first plating layer in the plurality of cell regions and a second plating layer in an outer periphery of the plurality of cell regions. The mask also includes a third plating layer between the plurality of cell regions. One of the second plating layer and the third plating layer may have the same thickness as the first plating layer.

According to an embodiment of the present disclosure, the uniformity in thickness of a plating layer on a conductive layer may be improved by uniformly forming the thickness of the conductive layer.

According to an embodiment of the present disclosure, the uniformity in thickness of a plating layer according to the position of a pattern region may be improved by forming an auxiliary region.

According to an embodiment of the present disclosure, the uniformity in thickness of a plating layer according to the position of a cathode may be improved by forming an auxiliary region including a conductive layer having different widths.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE SEVERAL VIEWS OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1A:
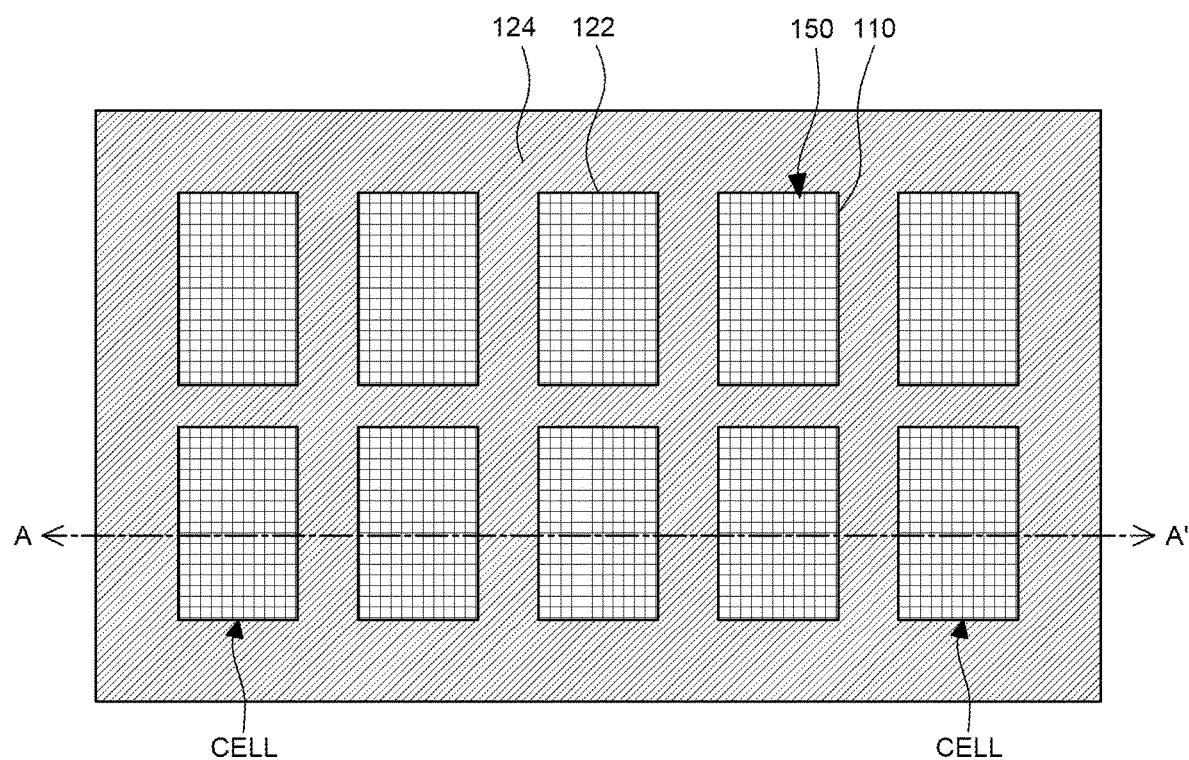
FIG. 1A through FIG. 1D are plan views and cross-sectional views for a method of manufacturing a mask according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products. Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

A shape, a size, a ratio, an angle, and a number disclosed in the drawings for describing embodiments of the present disclosure are merely an example. Thus, the present disclosure is not limited to the illustrated details. Unless otherwise described, like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, a mask and a method of manufacturing of the mask according to an embodiment of the present disclosure will be described in detail with reference to accompanying drawings. In adding reference numerals to elements of each of the drawings, although the same elements are illustrated in other drawings, like reference numerals may refer to like elements.

FIG. 1A through FIG. 1D are plan views and cross-sectional views for a method of manufacturing a mask according to an embodiment of the present disclosure.

A plating layer may be formed by electroplating and chemical plating. In the electroplating method, a substrate is immersed in a plating bath where a plating solution is stored and a current is allowed to flow to plate a partial region or entire region of the substrate. In the chemical plating, a substrate is immersed in a plating bath to plate a surface of the substrate.

Further, the electroplating method includes a vertical electroplating method and a horizontal electroplating method. In the vertical electroplating method, plating is performed in a state where the substrate is disposed vertically in the plating bath. In the horizontal electroplating method, plating is performed in a state where the substrate is disposed horizontally in the plating bath. Herein, the electroplating method will be described as an example, but the present disclosure is not limited thereto.

Figure 1B:
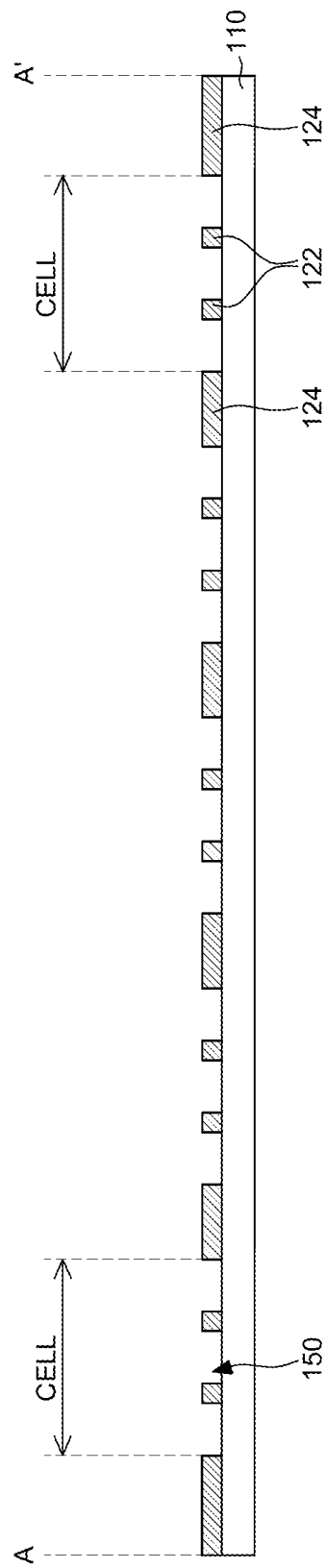

With reference to FIG. 1A and FIG. 1B, a first conductive layer 122 having a mesh shape is formed in a plurality of cell regions CELL on a substrate 110. Further, a second conductive layer 124 is formed to surround an outer periphery of the plurality of cell regions CELL.

The substrate 110 may be a substrate to support components formed on the substrate 110. The substrate 110 may be formed of an insulating material to suppress the application of a current to the substrate 110. The plurality of cell regions CELL corresponding to a plurality of electroluminescent display apparatuses may be disposed on the substrate 110. Each of the plurality of cell regions CELL includes a plurality of openings 150 corresponding to a plurality of pixels of an electroluminescent display apparatus.

The first conductive layer 122 and the second conductive layer 124 may be disposed on the substrate 110. The first conductive layer 122 and the second conductive layer 124 may be seed layers in a plating process to be performed later.

The first conductive layer 122 may define the plurality of openings 150 in the plurality of cell regions CELL. The second conductive layer 124 may be disposed to surround the outer periphery of the plurality of cell regions CELL. For example, the second conductive layer 124 may be a region where metal is formed in the entire region of the substrate 110 and may be referred to as an entire metal region. For example, the first conductive layer 122 may be a region where metal is formed in a pattern region and may be referred to as a pattern region or patterned metal region.

Figure 1C:
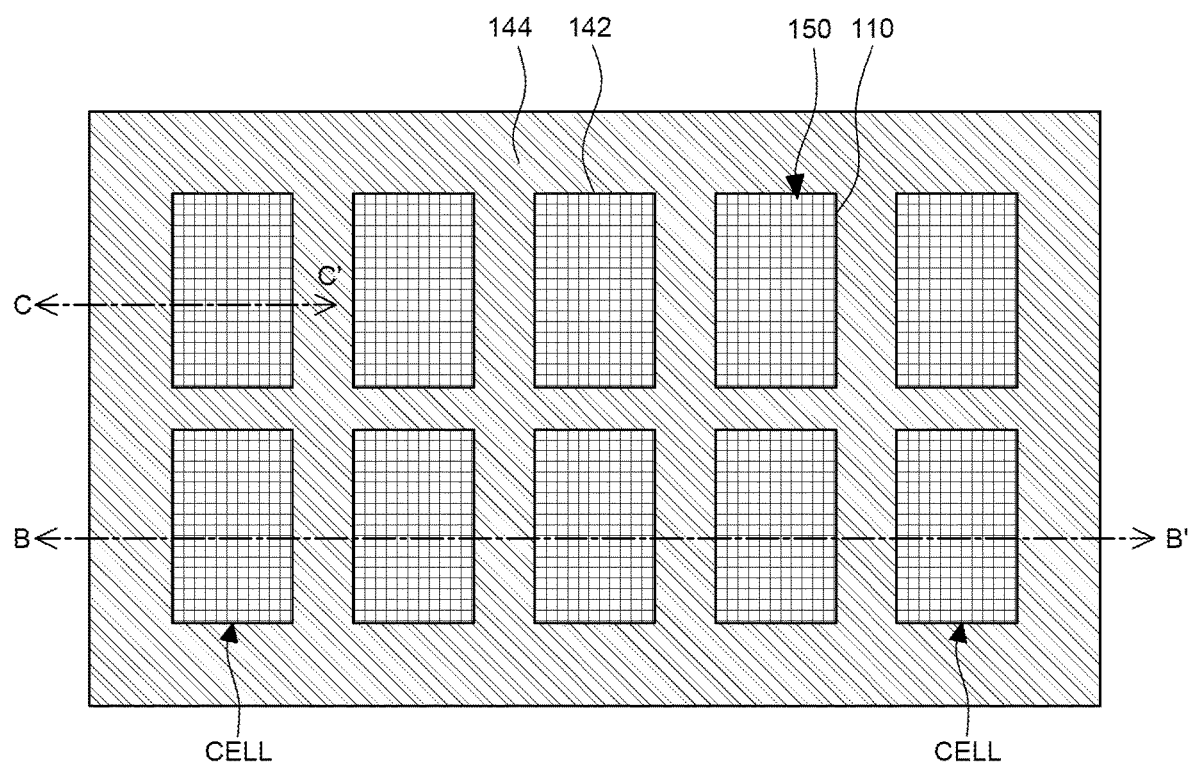
Figure 1D:
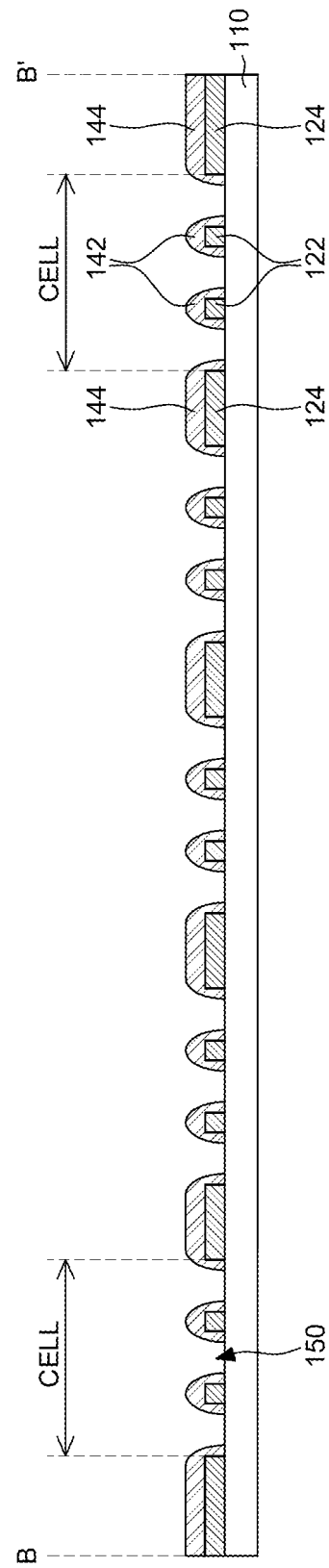

With reference to FIG. 1C and FIG. 1D, a first plating layer 142 and a second plating layer 144 may be formed by performing a plating process using the first conductive layer 122 and the second conductive layer 124 as seed layers.

The plating process for forming the first plating layer 142 and the second plating layer 144 on the first conductive layer 122 and the second conductive layer 124 is performed. Any plating method can be employed freely according to a design as long as it can form the first plating layer 142 and the second plating layer 144 formed of a metal material. In the method of manufacturing a mask according to an embodiment of the present disclosure, an electroplating method which is a wet plating method may be employed. In the plating process using the electroplating method, a current is applied to the first conductive layer 122 and the second conductive layer 124 that may be as seed layers. When a current flows in the first conductive layer 122 and the second conductive layer 124, the first plating layer 142 and the second plating layer 144 may be formed on the surfaces of the first conductive layer 122 and the second conductive layer 124, respectively. Therefore, the first plating layer 142 may be disposed on the first conductive layer 122 and the second plating layer 144 may be disposed on the second conductive layer 124.

Then, the substrate 110, the first conductive layer 122, and the second conductive layer 124 are separated from the first plating layer 142 and the second plating layer 144. For example, the first plating layer 142 and the second plating layer 144 may be separated from the substrate 110, the first conductive layer 122, and the second conductive layer 124.

As described above with reference to FIG. 1A through FIG. 1D, a mask including the plating layer can be manufactured through the plating process. However, the inventor of the present disclosure recognized that the thickness of the plating layer is changed due to a difference in an area of the conductive layer per unit area between a central portion of the pattern region and a peripheral portion of the pattern region. For example, the inventor of the present disclosure recognized that the area of the conductive layer is different between the entire metal region and the patterned metal region. Details thereof will be described with reference to FIG. 2 through FIG. 4.

Figure 2:
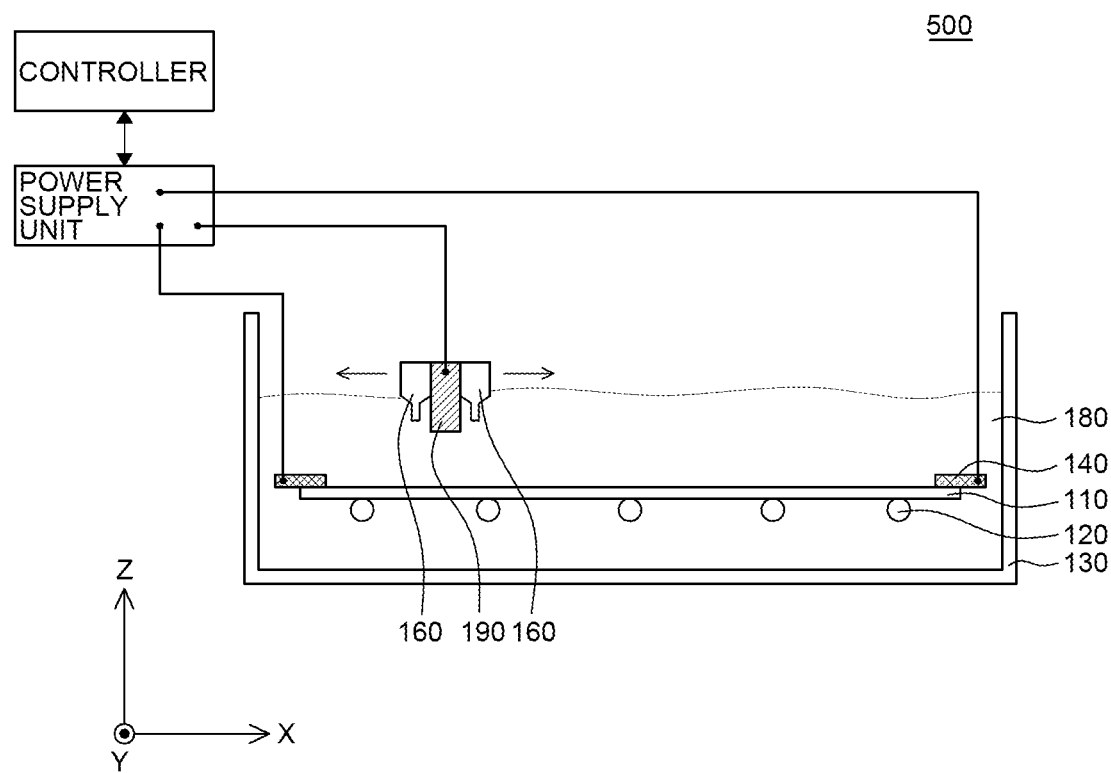
FIG. 2 illustrates an electroplating apparatus according to an embodiment of the present disclosure.

FIG. 2 illustrates an electroplating apparatus according to an embodiment of the present disclosure.

FIG. 2 illustrates a horizontal electroplating apparatus as an example.

With reference to FIG. 2, an electroplating apparatus 500 according to an embodiment of the present disclosure includes the substrate 110, a stage 120, a cathode 140, an anode 190, a plating bath 130, and a spray nozzle 160. The electroplating apparatus 500 further includes a driver configured to move the anode 190 in the X-axis direction, a plating solution 180, a power supply unit, and a controller.

The plating bath 130 provides an inside space where a plating solution 180 is filled. The plating bath 130 may have a hexahedral shape with an opening toward an upper portion of the bath, but is not limited thereto.

The stage 120 may be a substrate configured to support the substrate 110, which is a plating target object. The stage 120 may be disposed in the plating bath 130 to maintain a consistent horizontality. For example, the stage 120 may be disposed in a horizontal direction (X-axis/Y-axis direction). Further, the stage 120 may be disposed such that a surface of the substrate 110 on the stage 120 is parallel to a surface of the plating solution 180. FIG. 2 illustrates that the surface of the plating solution 180 is fluid to indicate that the plating solution 180 is liquid, but the surface of the plating solution 180 may be substantially parallel to the bottom surface of the plating bath 130.

The stage 120 may have a plurality of rod-shaped stages 120 spaced apart from each other in a specific direction. For example, the stage 120 includes a plurality of rod-shaped stages extended in the Y-axis direction, and the plurality of rod-shaped stages may be disposed parallel and spaced apart in the X-axis direction. However, the present disclosure is not limited thereto. For example, the stage 120 may be formed into a mesh shape or a plate shape.

The substrate 110 is a plating target object, and a plating layer is formed on the surface of the substrate 110 by the electroplating apparatus 500 according to an embodiment of the present disclosure. For example, a seed pattern as a seed during a plating process is formed of a conductive material on the substrate 110. The substrate 110 including the seed pattern thereon is disposed on the stage 120. The substrate 110 is disposed in a horizontal direction in the plating bath 130. Thus, when the plating bath 130 is filled with the plating solution 180, the surface of the substrate 110 may be disposed substantially parallel to the surface of the plating solution 180. The substrate 110 may be a conductor or a non-conductor, but is not limited thereto. Herein, it has been described that the substrate 110 and the seed pattern are separate components, but the substrate 110 may include the seed pattern.

If a plating process is performed by the horizontal electroplating method, it is possible to minimize the volume, e.g., occupied volume of the system. If in-line processes are used in a manufacturing process, a manufacturing target, e.g., a substrate, is moved in the horizontal direction during the manufacturing process. Thus, if the electroplating apparatus performs a plating process by the horizontal electroplating method, the substrate being disposed in the horizontal direction may be loaded into the plating bath. After the plated substrate is unloaded from the plating bath, the substrate may be moved as it is to a cleaning device or equipment. Thus, in the electroplating apparatus, any device for rotating the substrate from the horizontal direction to the vertical direction or vice versa is not required. Therefore, the volume of the system may be reduced. According to the vertical electroplating method, the plating bath needs to have a size more than double the lengthwise dimension of the substrate. However, according to the horizontal electroplating method, the plating bath 130 may have a size much smaller than the double of the size of the substrate 110. Thus, in the electroplating apparatus, the size of the plating bath 130 may be reduced to minimize the volume of the system.

The cathode 140 is disposed on both sides of the substrate 110 to apply a current to the substrate 110. For example, the cathode 140 may apply a current to the seed pattern disposed on the substrate 110. Thus, a plating layer may be formed on the surface of the substrate 110 by the flow of electricity between the cathode 140 and the anode 190. The cathode 140 may be disposed in the plating bath 130 and may be in contact with both sides of the substrate 110. Further, the cathode 140 on the both sides of the substrate 110 may also fix the substrate 110 so as not to move. For example, the cathode 140 may also be configured as a clamp to grasp both sides of the substrate 110, but is not limited thereto. If the substrate 110 can be fully fixed by the cathode 140, the stage 120 may not be provided.

The anode 190 is above the substrate 110, the anode 190 is spaced apart from the substrate 110, and applies a current to the substrate 110. The anode 190 may be configured to move in the X-axis direction by the driver.

The spray nozzle 160 sprays the plating solution 180 downwards toward the substrate 110. The spray nozzle 160 may be disposed adjacent to the anode 190. The spray nozzle 160 may be combined with the anode 190 and moved with the anode 190 in the X-axis direction. The spray nozzle 160 supplies the plating solution 180 from an upper portion of the substrate 110. Thus, the spray nozzle 160 can support the circulation of the plating solution 180 in the plating bath 130 and maintain a constant concentration of the plating solution 180. The spray nozzle 160 may include a plurality of spray nozzles in the Y-axis direction along the surface of the substrate 110. Because the plurality of spray nozzles 160 is used, the plating solution 180 may be rapidly supplied when electroplating is performed. Further, the spray nozzle 160 may be disposed on only one surface or on both surfaces of the substrate 110 based on the X-axis direction that is the movement direction of the anode 190. Further, the spray nozzle 160 may be rotatable with adjustable spraying direction and angle.

The plating solution 180 may fill in the plating bath 130. The power supply unit is electrically connected to the cathode 140 and the anode 190 and applies a current. For example, the power supply unit may apply a voltage to the cathode 140 and the anode 190 to allow a constant current to flow between the cathode 140 and the anode 190. A mask which is a product manufactured by using the electroplating apparatus and the electroplating method according to an embodiment of the present disclosure may be used to deposit an organic layer in a heated environment instead of at a room temperature. The mask may be formed of, e.g., Invar or the like, but is not limited thereto. If the electroplating apparatus uses Invar for plating, the plating solution 180 may be a mixture solution. The mixture solution may be composed of anhydrous nickel sulfate ($NiSO_4$), nickel ions using nickel chloride (NiCl$_2$) or the like, an iron ion source using anhydrous iron sulfate (FeSO$_4$) or the like, a pH regulator such as boric acid, polish, a stress reliever, and a stabilizer, etc. However, the present disclosure is not limited thereto. Herein, it is assumed that the plating layer is formed of Invar, but a material of the plating layer is not limited thereto.

The power supply unit may apply a constant voltage such as a direct current (DC) voltage to the anode 190 and apply an alternating current (AC) voltage to the cathode 140. Herein, the AC voltage may have various waveforms such as a sine wave, a pulse wave, or a triangle wave, but is not limited thereto.

The controller is connected to the power supply unit and controls currents applied from the power supply unit to the cathode 140 and the anode 190.

Therefore, the cathode 140 may apply a current to the seed pattern on the substrate 110. Thus, a plating layer may be formed on the surface of the substrate 110 by the flow of electricity between the cathode 140 and the anode 190. A plating layer adjacent to the cathode 140 is increased in thickness because the current density is increased. Further, a plating layer in a central portion of a cell region distant from the cathode is decreased in thickness because the current density is decreased. The horizontal electroplating method has been described as an example. Even in the vertical electroplating method, there may be a difference in an area of plating caused by a difference in current density. Details thereof will be described with reference to FIG. 3A through FIG. 3C and FIG. 4.

Figure 3A:
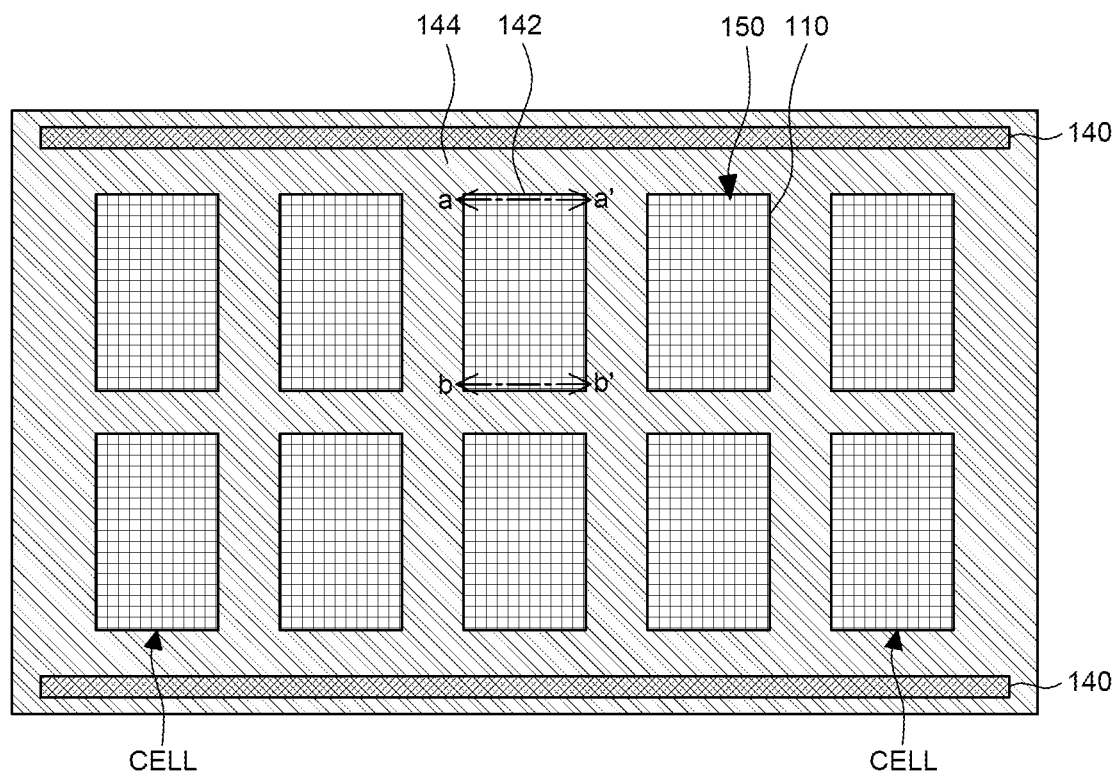
FIG. 3A through FIG. 3C are provided to explain a difference in thickness of a plating layer according to an embodiment of the present disclosure.
Figure 3B:
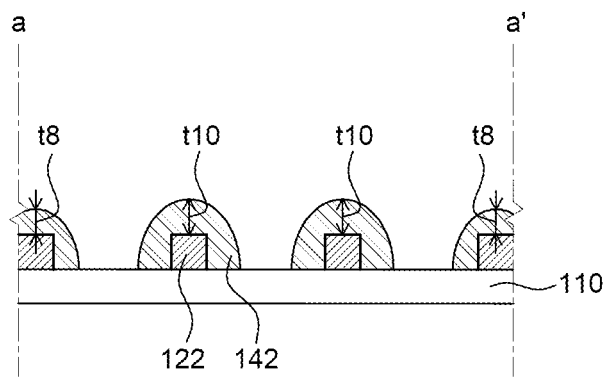
Figure 3C:
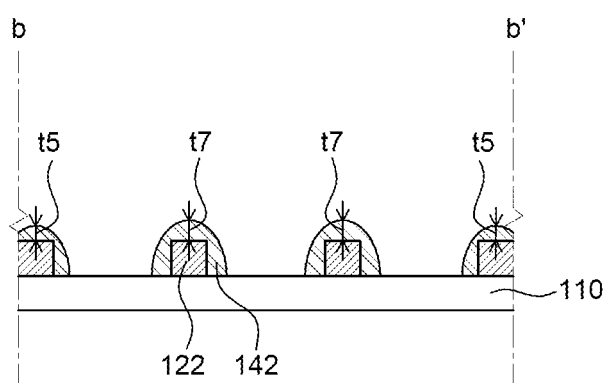

FIG. 3A through FIG. 3C are provided to explain a difference in thickness of a plating layer according to an embodiment of the present disclosure.

As shown in FIG. 3A, the cathode 140 may be disposed on upper and lower portions of the substrate 110 and a plating process may be performed. FIG. 3B illustrates the thickness of a plating layer indicated by arrow a-a' in FIG. 3A. FIG. 3C illustrates the thickness of a plating layer indicated by arrow b-b' in FIG. 3A. In FIG. 3B and FIG. 3C, a reference thickness of the plating layer is, for example, 10 μm. However, the present disclosure is not limited thereto. In FIG. 3B and FIG. 3C, the reference thickness of 10 μm is denoted as t10, and a lower value means a smaller thickness based on t10.

With reference to FIG. 3B, the first plating layer 142 is formed on the first conductive layer 122 in a pattern region. The thickness of the first plating layer 142 in a central portion of the pattern region is t10, i.e., 10 μm, which is the reference thickness of the plating layer. The thickness of the first plating layer 142 in a peripheral portion of the pattern region is t8. Herein, t8 is smaller than 10 μm, which is the reference thickness. Therefore, it can be seen that the plating layer in the peripheral portion of the pattern region is smaller in thickness than the plating layer in the central portion of the pattern region. This is because the area of the plating layer per unit area is greater in the peripheral portion of the pattern region than in the central portion during a plating process, and, thus, the thickness of the plating layer in the peripheral portion is decreased.

With reference to FIG. 3C, the first plating layer 142 is formed on the first conductive layer 122 in a pattern region. The thickness of the first plating layer 142 in a central portion of the pattern region is t7. The thickness of the first plating layer 142 in a peripheral portion of the pattern region is t5. It may be shown that the plating layer in the peripheral portion of the pattern region is smaller in thickness than the plating layer in the central portion of the pattern region. This is because the area of the plating layer per unit area is greater in the peripheral portion of the pattern region than in the central portion during a plating process, and, thus, the thickness of the plating layer in the peripheral portion is decreased. By comparison between the central portion of the pattern region in FIG. 3B and the central portion of the pattern region in FIG. 3C, it may be shown that the thickness of the plating layer is decreased from t10 as shown in FIG. 3B to t7 as shown in FIG. 3C. While the plating process is performed, the region shown in FIG. 3B is adjacent to the cathode and thus has a low resistance and a high current density. Thus, the thickness of the plating layer may be increased. Further, the region shown in FIG. 3C is distant from the cathode and has a high resistance and a low current density. Thus, the thickness of the plating layer is decreased. By comparison between the peripheral portion of the pattern region in FIG. 3B and the peripheral portion of the pattern region in FIG. 3C, it may be shown that the thickness of the plating layer is decreased from t8 as shown in FIG. 3B to t5 as shown in FIG. 3C. While the plating process is performed, the region shown in FIG. 3B is adjacent to the cathode and thus has a low resistance and a high current density. Thus, the thickness of the plating layer is increased. Further, the region shown in FIG. 3C is distant from the cathode and has a high resistance and a low current density. Thus, the thickness of the plating layer is decreased.

Figure 4:
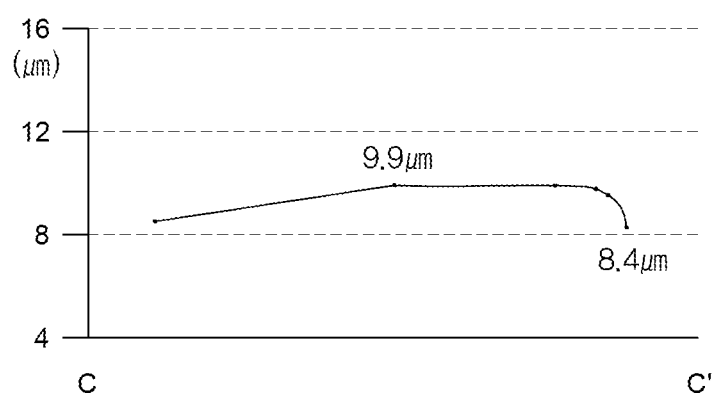
FIG. 4 is a graph showing the measured thickness of a plating layer according to an embodiment of the present disclosure.

FIG. 4 is a graph showing the measured thickness of a plating layer according to an embodiment of the present disclosure.

A vertical axis in FIG. 4 represents the thickness (μm) of a plating layer, and a horizontal axis represents a region indicated by arrow C-C' in FIG. 1C. With reference to FIG. 4, it can be seen that the thickness of the plating layer is changed from 9.9 μm to 8.4 μm. For example, the thickness of the plating layer in a central portion of the patterned metal region or pattern region may be 9.9 μm and the thickness of the plating layer in a peripheral portion of the patterned metal region or pattern region may be 8.4 μm. For example, the first plating layer 142 in the central portion of the pattern region may have a thickness of 9.9 μm and the first plating layer 142 in the peripheral portion of the pattern region may have a thickness of 8.4 μm. It may be shown that the plating layer in the pattern region has a thickness difference of about 15%. Further, it may be shown that the plating layer in a cell region or a single panel has a thickness difference of about 15%.

The thickness of a plating layer is affected by Amperes per Square Deci-Meter (ASD), and a current density may be generated by a difference in resistance depending on the area of a plating layer and the position of plating. As described above with reference to FIG. 3A through FIG. 3C, during a plating process, the plating layer in the portion adjacent to the cathode is increased in thickness and the plating layer in the portion distant from the cathode is decreased in thickness. Further, the plating layer has a smaller thickness in the peripheral portion of the pattern region than in the central portion of the pattern region. This is because the area of the plating layer per unit area is greater in the peripheral portion of the pattern region than in the central portion during a plating process, and, thus, the thickness of the plating layer in the peripheral portion is decreased. For example, if a plating process is performed with cathodes connected vertically, a region adjacent to the cathodes may have a low resistance and a high current density. Thus, the thickness of a plating layer may be increased. Further, a region distant from the cathodes may have a high resistance and a low current density. Thus, the thickness of a plating layer may be decreased. Accordingly, there may be a difference in thickness between an outer peripheral portion of a cell region with a high current density, e.g., a second plating layer and a central portion with a low current density, e.g., a first plating layer. Therefore, the inventor of the present disclosure invented a mask having a new structure in which the area of a plating layer may be uniformly maintained according to the position of plating. Details thereof will be described with reference to FIG. 5A through FIG. 9B.

Figure 5A:
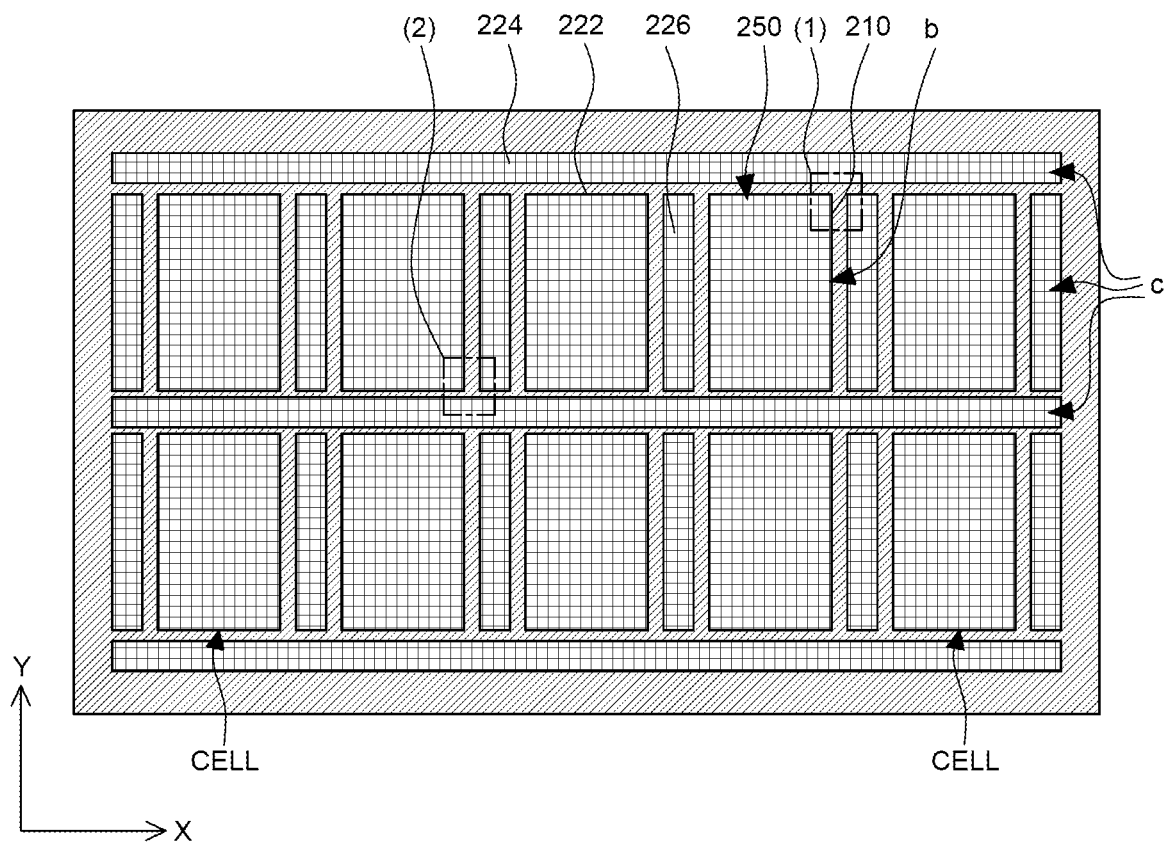
FIG. 5A through FIG. 5C illustrate a mask according to another embodiment of the present disclosure.
Figure 5B:
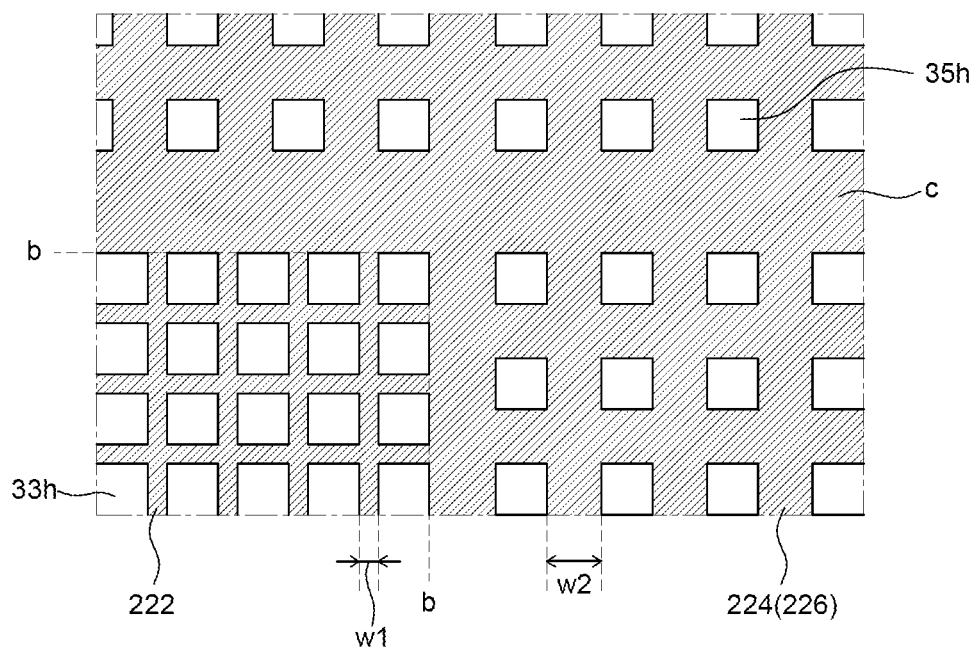
Figure 5C:
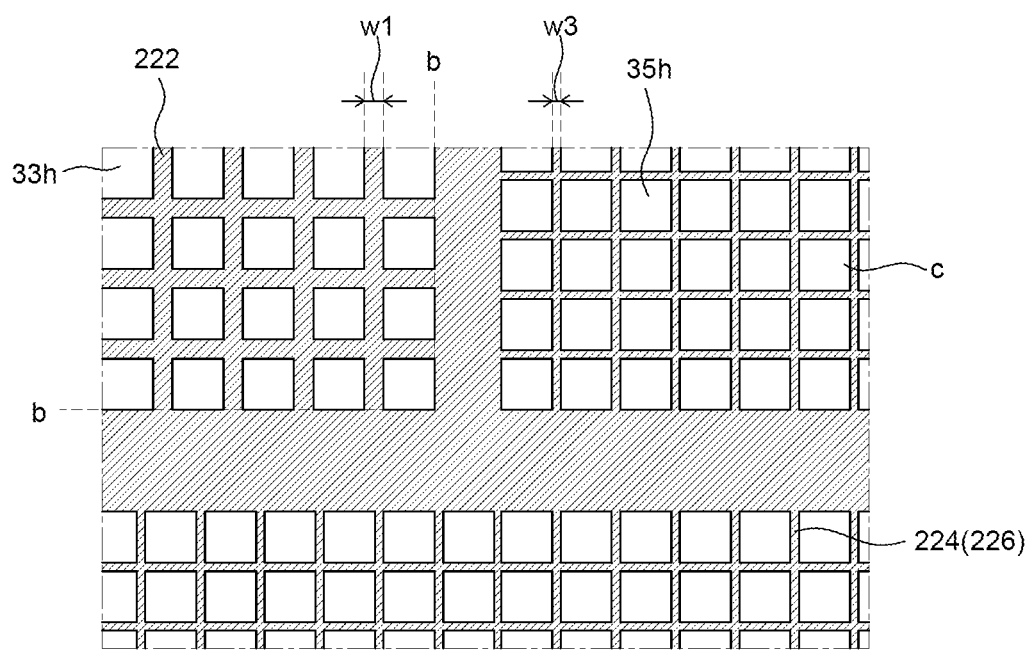

FIG. 5A through FIG. 5C illustrate a mask according to another embodiment of the present disclosure.

As described above with reference to FIG. 1 through FIG. 4, to solve the problem of difference in thickness of a plating layer for each plating position, a finally manufactured mask may be welded to, e.g., a frame and a dummy pattern may be disposed around a plating layer. If the dummy pattern is formed by laser processing or the like, the plating layer may be deformed. If the plating layer is deformed, the position accuracy of the mask is changed, which may cause a defect in the mask. For example, the deformation of the mask and the change in position accuracy of the mask may cause a change in position of a hole of the mask and a pattern of the substrate deposited when an emission layer is deposited. Therefore, the emission layer cannot be deposited or may be partially deposited, or an unwanted emission layer may be deposited. To overcome this problem, the inventor of the present disclosure conducted various experiments for making the thickness of a plating layer uniform. If the thickness of a plating layer is formed uniform after the plating layer is formed, a mask may have a defect due to the deformation of the plating layer. To solve this problem, the inventor of the present disclosure conducted various experiments for making the thickness of a conductive layer uniform. Herein, the conductive layer is a seed layer for the plating layer. For example, a conductive layer is formed as a plating layer through a plating process. Thus, if the thickness of the conductive layer as a seed layer for the plating layer is formed uniform, the plating layer formed on the conductive layer may have a uniform thickness. Accordingly, the inventor of the present disclosure invented a mask having a new structure in which the thickness of a plating layer formed on a conductive layer can be uniformly maintained by uniformly maintaining the thickness of the conductive layer, through various experiments.

With reference to FIG. 5A through FIG. 5C, the plurality of cell regions CELL corresponding to a plurality of electroluminescent display apparatuses may be disposed on a substrate 210. Each cell region CELL may include a plurality of openings 250 corresponding to a plurality of pixels of an electroluminescent display apparatus.

The substrate 210 may be a substrate to support components formed on the substrate 210. The substrate 210 may be formed of an insulating material to suppress the application of a current to the substrate 210.

A pattern region b and an auxiliary region c may be disposed on the substrate 210. The auxiliary region c may be disposed to make the thickness of a plating layer uniform. The plating layer is disposed on a conductive layer in the pattern region b. For example, the auxiliary region c may surround the pattern region b. The auxiliary region c may refer to the other region except the pattern region b. For example, the auxiliary region c may be a dummy region, but is not limited to the term. The pattern region b may be an opening, but is not limited to the term.

A first direction may be a horizontal direction (X-axis direction) and a second direction may be a vertical direction (Y-axis direction). The auxiliary region c may be disposed along the side in the first direction and the side in the second direction. For example, the auxiliary region c may be disposed as extended along the first direction and the second direction to surround the plurality of cell regions CELL.

A second conductive layer 224 and a third conductive layer 226 may be disposed in the auxiliary region c. For example, a region where the second conductive layer 224 and the third conductive layer 226 are formed may be the auxiliary region c. The second conductive layer 224 in the auxiliary region c may be a conductive layer disposed to surround the plurality of cell regions CELL. For example, the second conductive layer 224 may be disposed adjacent to the plurality of cell regions CELL along the first direction. For example, the second conductive layer 224 may be disposed along the first directional sides of the plurality of cell regions CELL. For example, the second conductive layer 224 may be disposed as extended along the first direction of the plurality of cell regions CELL.

The third conductive layer 226 of the auxiliary region c may be a conductive layer between the plurality of cell regions CELL. For example, the third conductive layer 226 may be disposed adjacent to the plurality of cell regions CELL along the second direction. For example, the third conductive layer 226 may be disposed along the second directional sides of the plurality of cell regions CELL and may separate the plurality of cell regions CELL. For example, the third conductive layer 226 may be located between a plurality of cell regions CELL disposed adjacent to each other in the first direction among the plurality of cell regions CELL. For example, the third conductive layer 226 may be disposed along the second directional sides between a plurality of cell regions CELL disposed adjacent to each other in the first direction among the plurality of cell regions CELL.

A first conductive layer 222 may be disposed in the pattern region b. The pattern region b may include the openings 250 in the plurality of cell regions CELL.

The first conductive layer 222 of the pattern region b may have a mesh shape in the plurality of cell regions CELL. The first conductive layer 222 may define the plurality of openings 250 corresponding to a plurality of pixels of an electroluminescent display apparatus in the plurality of cell regions CELL. The first conductive layer 222 may have a mesh shape in the plurality of cell regions CELL.

The first conductive layer 222, the second conductive layer 224, and the third conductive layer 226 may be seed layers in a plating process to be performed later. The first conductive layer 222, the second conductive layer 224, and the third conductive layer 226 may be formed of the same material. The first conductive layer 222, the second conductive layer 224, and the third conductive layer 226 may be formed as seed layers of a metal material which is conductive to allow a current to flow. For example, the first conductive layer 222, the second conductive layer 224, and the third conductive layer 226 may be formed of ITO on molybdenum (ITO/Mo), copper (Cu) on a molybdenum-titanium alloy (MoTi), and ITO on copper (ITO/Cu). However, the present disclosure is not limited thereto.

The first conductive layer 222, the second conductive layer 224, and the third conductive layer 226 may be formed by sputtering, but is not limited thereto. For example, the first conductive layer 222, the second conductive layer 224, and the third conductive layer 226 may be formed by using various manufacturing processes such as rolling or the like.

FIG. 5B illustrates Area (1) of FIG. 5A. FIG. 5C illustrates Area (2) of FIG. 5A. In FIG. 5B and FIG. 5C, the pattern region b is indicated by a dotted line, and the auxiliary region c is the other region expect the pattern region b. A hole 33*h* in the pattern region b and a hole 35*h* in the auxiliary region c are illustrated to distinguish a region where the conductive layers 222, 224, and 226 are not formed. A plating layer may be formed on upper surfaces of the conductive layers in the pattern region b and the auxiliary region c through a plating process.

With reference to FIG. 5B, the pattern region b and the auxiliary region c have the substantially same distance from the cathode in Area (1). Thus, there is no difference in thickness of a plating layer between the pattern region b and the auxiliary region c. However, as described above with reference to FIG. 3A through FIG. 3C and FIG. 4, there may be a difference in thickness of a plating layer between a central portion and a peripheral portion of the pattern region b in the X-axis direction or first direction. Therefore, the auxiliary region c is added to make the areas and current densities of the conductive layers in the central portion and a peripheral portion of the pattern region b similar to each other. Thus, a difference in thickness of the plating layer can be reduced. Because the auxiliary region c is added, the current density may be increased, and, thus, the thickness of the plating layer may be increased. The conductive layers in the auxiliary region c have a greater width w2 in Area (1) than in Area (2), and, thus, the current density may be less increased and the thickness of the plating layer may be less increased. Therefore, the thickness of the plating layer in Area (1) may become similar to that of the plating layer in Area (2).

With reference to FIG. 5C, the conductive layers in the auxiliary region c may have a smaller width w3 in Area (2) than in Area (1). Because Area (2) is distant from the cathode, the thickness of the plating layer may be decreased. Therefore, to increase the current density, the area of the conductive layer may be reduced by narrowing the width of the conductive layer. In the wiring of the pattern region b, the hole 33*h* where an organic material is deposited needs to have the same size in the X-axis direction and/or the Y-axis direction. Therefore, the width of the conductive layers and the thickness of the plating layer in the pattern region b need to be maintained uniform. In the case where the width of the conductive layers in the pattern region b is changed, even if the thickness of the plating layer is uniform after plating, the size of the hole 33*h* is changed. Therefore, a desired organic layer cannot be deposited. Accordingly, the yield of manufacturing electroluminescent display apparatuses may be decreased. Therefore, to improve the uniformity in thickness of the plating layer in the X-axis direction, the auxiliary region c is formed. Further, to improve the uniformity in thickness of the plating layer in the Y-axis direction, the width of the conductive layers in the auxiliary region c is adjusted. For example, the auxiliary region may be formed around the pattern region depending on a difference in thickness of the conductive layers in the pattern region b. The ratios of the conductive layers in the central portion and the peripheral portion of the pattern region may be similar or identical to each other due to the auxiliary region. As another example, the width of the auxiliary region can be regulated depending on the distance from the cathode. For example, the conductive layers in the auxiliary region distant from the cathode may have a smaller width and the conductive layers in the auxiliary region near or adjacent to the cathode may have a greater width. Thus, the current density may be adjusted. The position of the auxiliary region is not limited to the illustration in FIG. 5A through FIG. 5C.

An auxiliary region is formed according to the position of a conductive layer or a plating layer on the conductive layer which is a seed layer for the plating layer. Further, the width of the conductive layer in the auxiliary region is adjusted to uniformly maintain the thickness of the plating layer. Therefore, the position accuracy of the mask may be enhanced due to the uniform thickness of the plating layer.

FIG. 6A through FIG. 6F illustrate a process for forming an auxiliary region according to another embodiment of the present disclosure. The auxiliary region may include the conductive layer 224 or 226.

Figure 6A:
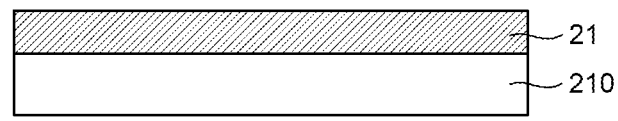
FIG. 6A through FIG. 6F illustrate a process for forming an auxiliary region according to another embodiment of the present disclosure.
Figure 6B:
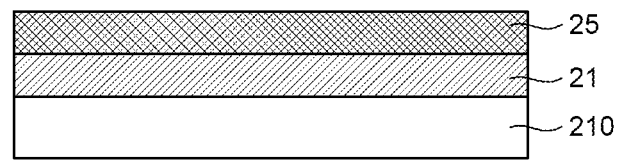
Figure 6C:
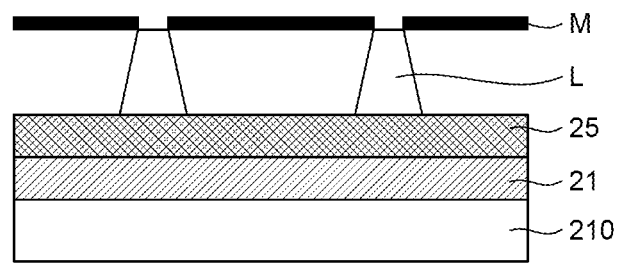
Figure 6D:
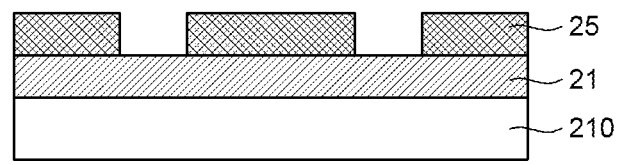
Figure 6E:
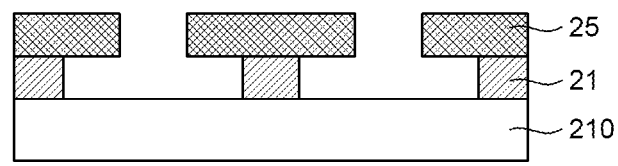
Figure 6F:
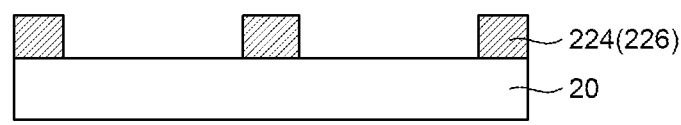

With reference to FIG. 6A and FIG. 6B, a material 21 to be formed in an auxiliary region may be formed on the substrate 210. A photoresist 25 may be formed on the material 21 to be formed in an auxiliary region and a conductive layer may be formed in the auxiliary region by photolithography. The photoresist 25 may be a photosensitive resin which is changed in solubility to a developer by light. A pattern may be obtained by performing exposure and development to the photoresist. The photoresist can be classified into a positive photoresist and a negative photoresist. With the positive photoresist, a light exposure part is increased in solubility to a developer by exposure to light and then the light exposure part is removed by development, so that a pattern may be obtained. With the negative photoresist, a light exposure part is greatly decreased in solubility to a developer by exposure to light and then a non-light exposure part is removed by development, so that a pattern may be obtained. As shown in FIG. 6C and FIG. 6D, light L is irradiated through a mask M and then development is performed. As shown in FIG. 6E and FIG. 6F, the material 21 formed on the auxiliary region is etched and the photoresist 25 is stripped to form the conductive layer 224 or 226 in the auxiliary region. The width of the conductive layer 224 or 226 in the auxiliary region may be adjusted by controlling the position of the mask M.

FIG. 7A through FIG. 7D are plan views and cross-sectional views for a method of manufacturing a mask according to another embodiment of the present disclosure.

Figure 7A:
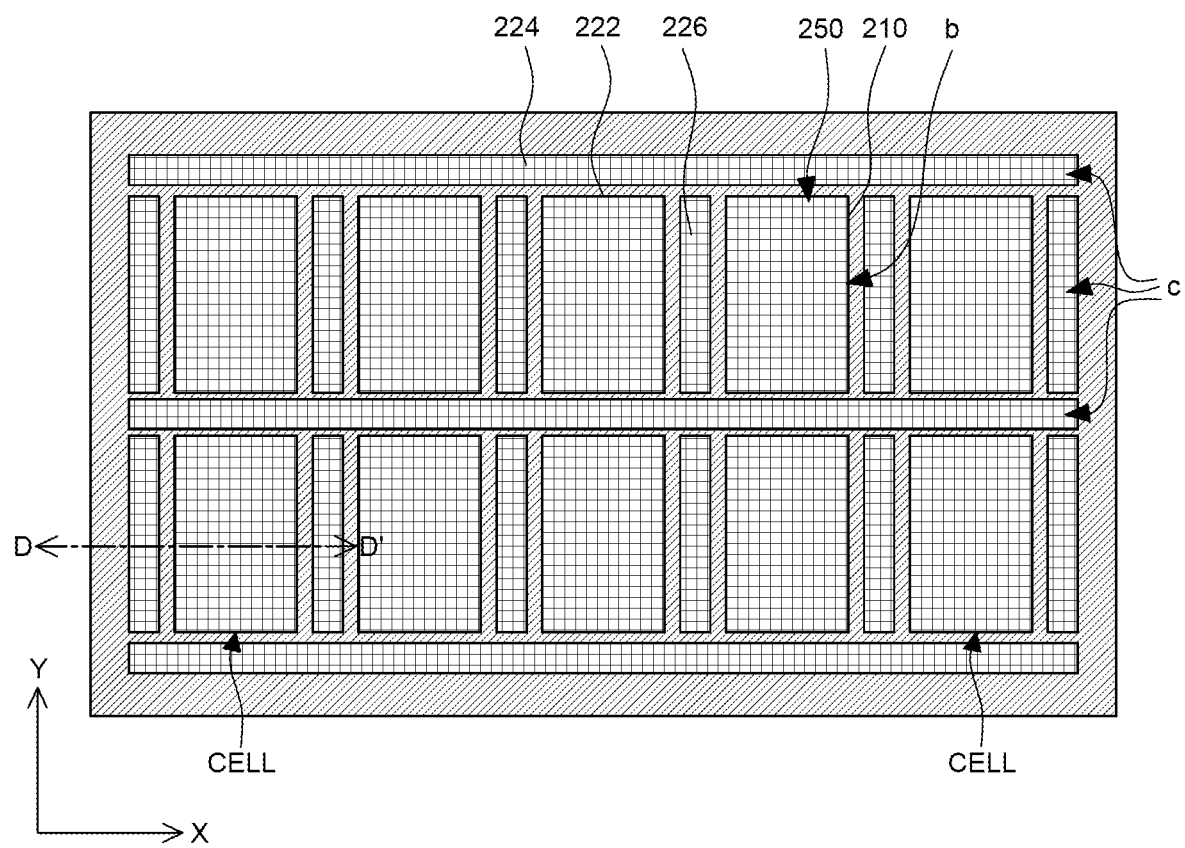
FIG. 7A through FIG. 7D are plan views and cross-sectional views for a method of manufacturing a mask according to another embodiment of the present disclosure.
Figure 7B:
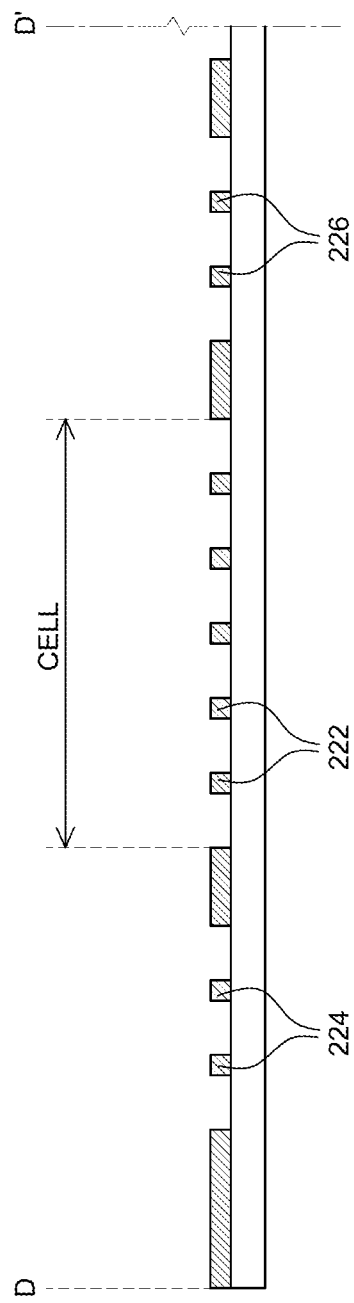

With reference to FIG. 7A and FIG. 7B, the pattern region b and the auxiliary region c may be disposed on the substrate 210.

The first conductive layer 222, the second conductive layer 224, and the third conductive layer 226 may be formed on the substrate 210. For example, the first conductive layer 222 may be formed in the pattern region b. For example, the second conductive layer 224 and the third conductive layer 226 may be formed in the auxiliary region c. The first conductive layer 222, the second conductive layer 224, and the third conductive layer 226 may be seed layers in a plating process to be performed later. For example, the first conductive layer 222, the second conductive layer 224, and the third conductive layer 226 may be formed as plating layers in a plating process to be performed later. The first conductive layer 222, the second conductive layer 224, and the third conductive layer 226 may be formed of the same material. The first conductive layer 222, the second conductive layer 224, and the third conductive layer 226 may be formed as seed layers of a metal material which is conductive to allow a current to flow. For example, the first conductive layer 222, the second conductive layer 224, and the third conductive layer 226 may be formed of ITO on molybdenum (ITO/Mo), copper (Cu) on a molybdenum-titanium alloy (MoTi), and ITO on copper (ITO/Cu). However, the present disclosure is not limited thereto.

Figure 7C:
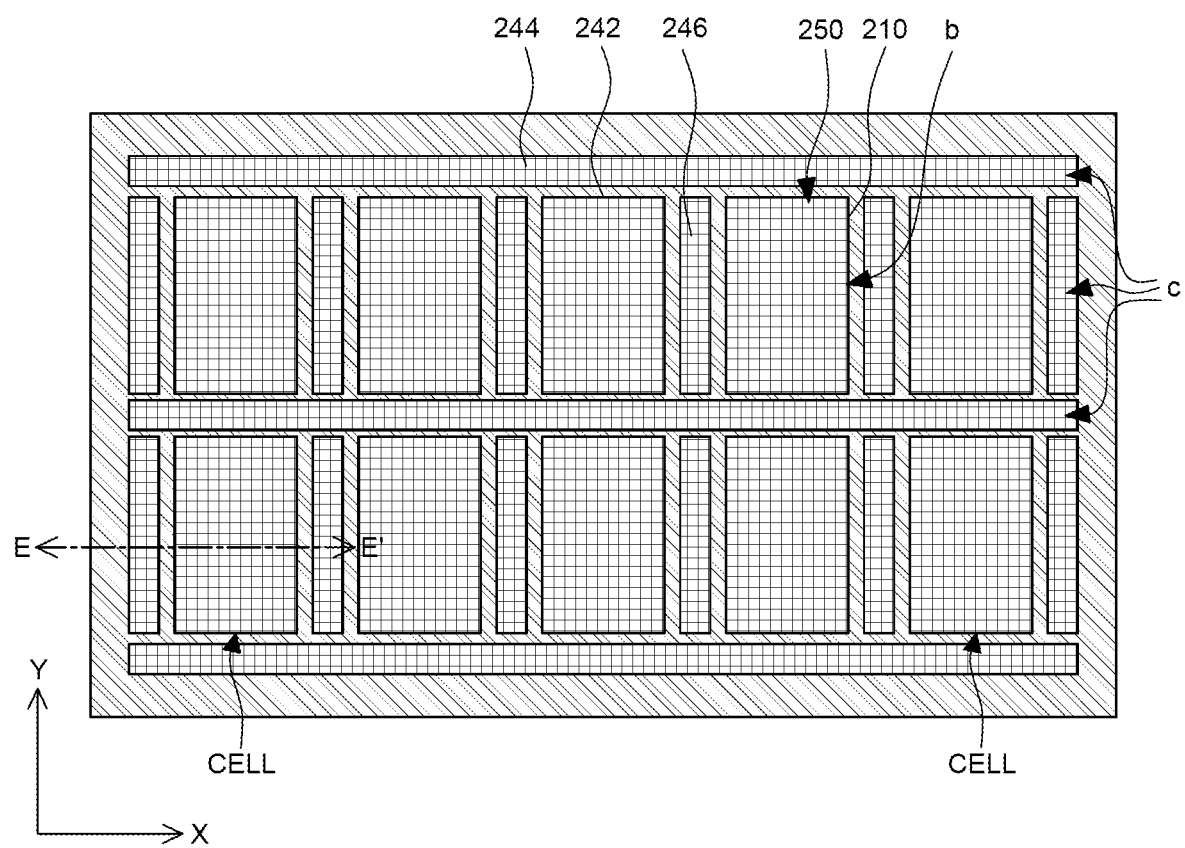
Figure 7D:
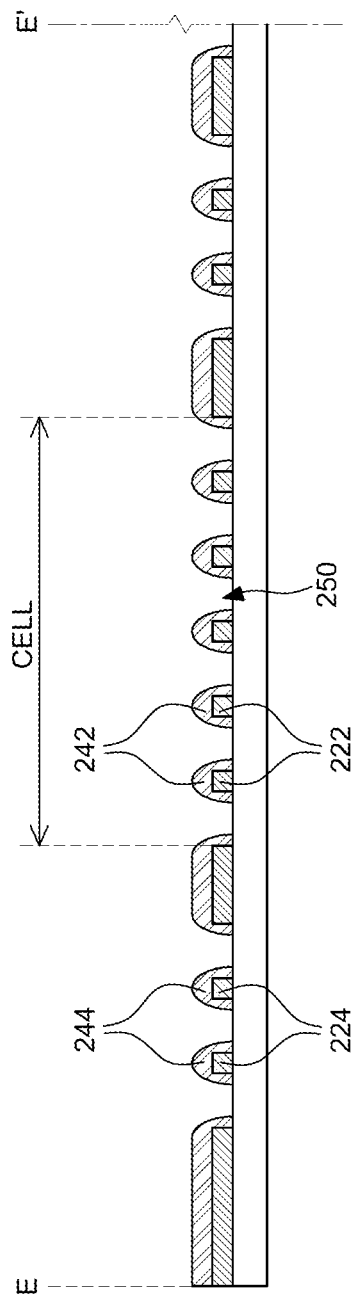

With reference to FIG. 7C and FIG. 7D, a plating process is performed using the first conductive layer 222, the second conductive layer 224, and the third conductive layer 226 as seed layers. Thus, a first plating layer 242, a second plating layer 244, and a third plating layer 246 are formed.

A plating process for forming the first plating layer 242, the second plating layer 244, and the third plating layer 246 on the first conductive layer 222, the second conductive layer 224, and the third conductive layer 226 is performed. The first plating layer 242, the second plating layer 244, and the third plating layer 246 may be formed of the same material. Any plating method can be employed freely according to a design as long as it can form the first plating layer 242, the second plating layer 244, and the third plating layer 246 of a metal material. In the method of manufacturing a mask according to an embodiment of the present disclosure, an electroplating method which is a wet plating method may be employed. For example, the electroplating method may include a vertical electroplating method in which plating is performed in a state where the substrate 210 including the first conductive layer 222, the second conductive layer 224, and the third conductive layer 226 is disposed vertically in a plating bath. The electroplating method may also include a horizontal electroplating method in which plating is performed in a state where the substrate 210 including the first conductive layer 222, the second conductive layer 224, and the third conductive layer 226 is disposed horizontally in a plating bath.

In the plating process using the electroplating method, a current is applied to the first conductive layer 222, the second conductive layer 224, and the third conductive layer 226 as seed layers. When a current flows in the first conductive layer 222, the second conductive layer 224, and the third conductive layer 226, the first plating layer 242, the second plating layer 244, and the third plating layer 246 may be formed on the surfaces of the first conductive layer 222, the second conductive layer 224, and the third conductive layer 226.

For example, the first plating layer 242 may be formed on the first conductive layer 222 and the second plating layer 244 may be formed on the second conductive layer 224. Further, the third plating layer 246 may be formed on the third conductive layer 226. The first plating layer 242, the second plating layer 244, and the third plating layer 246 are plated to surround the side surfaces of the first conductive layer 222, the second conductive layer 224, and the third conductive layer 226. Thus, an opening between the first plating layers 242 may have a smaller size than the opening 250 between the first conductive layers 222.

The substrate 210, the first conductive layer 222, the second conductive layer 224, and the third conductive layer 226 are separated from the first plating layer 242, the second plating layer 244, and the third plating layer 246. For example, the first plating layer 242, the second plating layer 244, and the third plating layer 246 may be separated from the substrate 210, the first conductive layer 222, the second conductive layer 224, and the third conductive layer 226.

Then, the first plating layer 242, the second plating layer 244, and the third plating layer 246 separated from the substrate 210, the first conductive layer 222, the second conductive layer 224, and the third conductive layer 226 are welded to a frame. For example, the separated plating layers may be welded to the frame after extension, e.g., four-sided extension. The plating layers 242, 244, and 246 welded to the frame may be used as a mask 200 according to an embodiment of the present disclosure.

As another example, the substrate, the first plating layer 242, the second plating layer 244, and the third plating layer 246 may be welded to a frame and then, the substrate may be removed. The resultant product may be used as the mask 200 according to another embodiment of the present disclosure.

As another example, the first plating layer 242, the second plating layer 244, and the third plating layer 246 from which the first conductive layer 222, the second conductive layer 224, and the third conductive layer 226 have been separated before being welded to a frame may be used as the mask 200 according to yet another embodiment of the present disclosure.

Figure 8A:
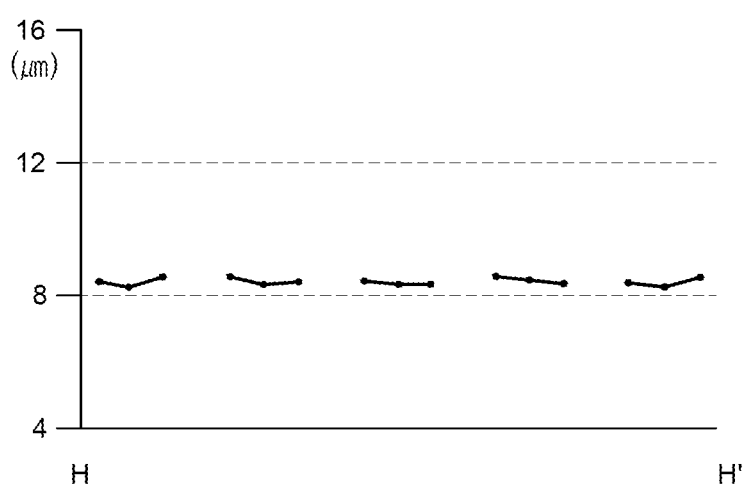
FIG. 8A and FIG. 8B show the measured thickness of a plating layer according to another embodiment of the present disclosure.
Figure 8B:
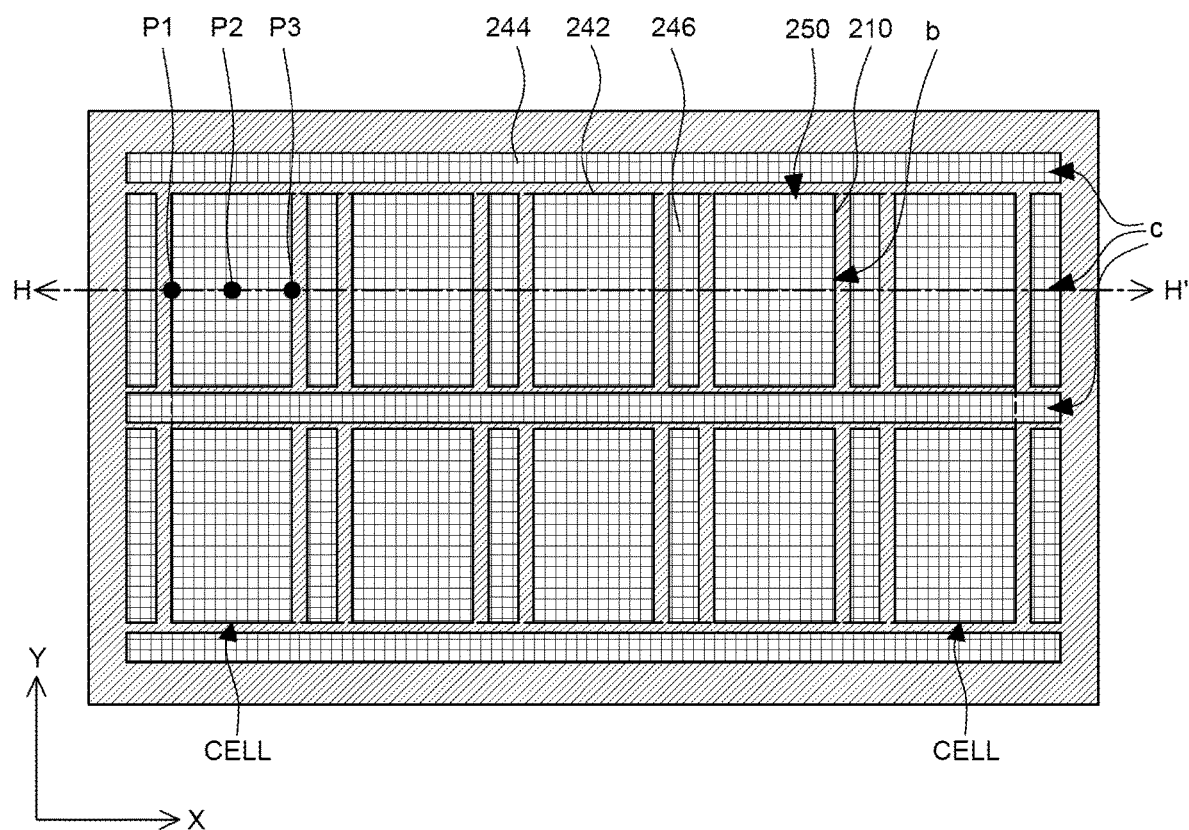

FIG. 8A and FIG. 8B show the measured thickness of a plating layer according to another embodiment of the present disclosure.

FIG. 8A shows the measured thickness of a plating layer taken along a line H-H' in FIG. 8B when applied as shown in FIG. 5A through FIG. 5C.

With reference to FIG. 8A and FIG. 8B, the thickness of a plating layer was measured from three points in each of five cell regions. For example, the thickness of the plating layer was measured from three points in FIG. 8B, i.e., P1, P2, and P3. With reference to FIG. 8A, it can be seen that the plating layer in the cell region has a thickness difference of less than 5%. For example, it can be seen that the plating layer has a thickness difference of less than 5% between the central portion and the peripheral portion of the pattern region. For example, the thickness difference of the plating layer is reduced by 10% or more compared to that of FIG. 4. Therefore, it may be shown that the thickness of the plating layer may be maintained uniformly by the auxiliary region. Thus, the thickness of the plating layer throughout the entire substrate may be maintained uniformly.

Figure 9A:
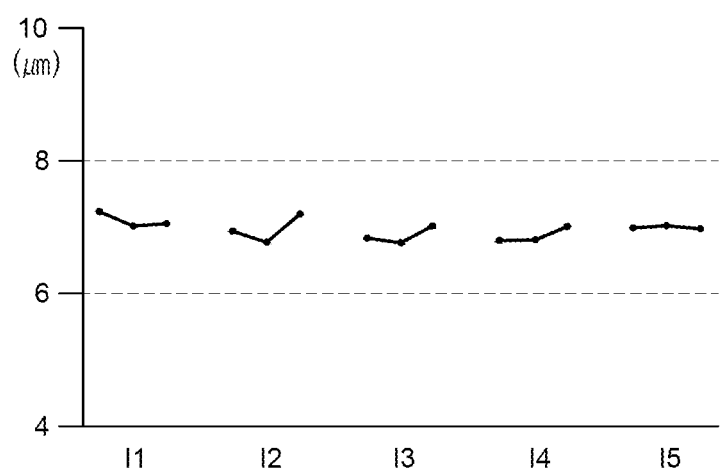
FIG. 9A and FIG. 9B show the measured thickness of a plating layer according to another embodiment of the present disclosure.
Figure 9B:
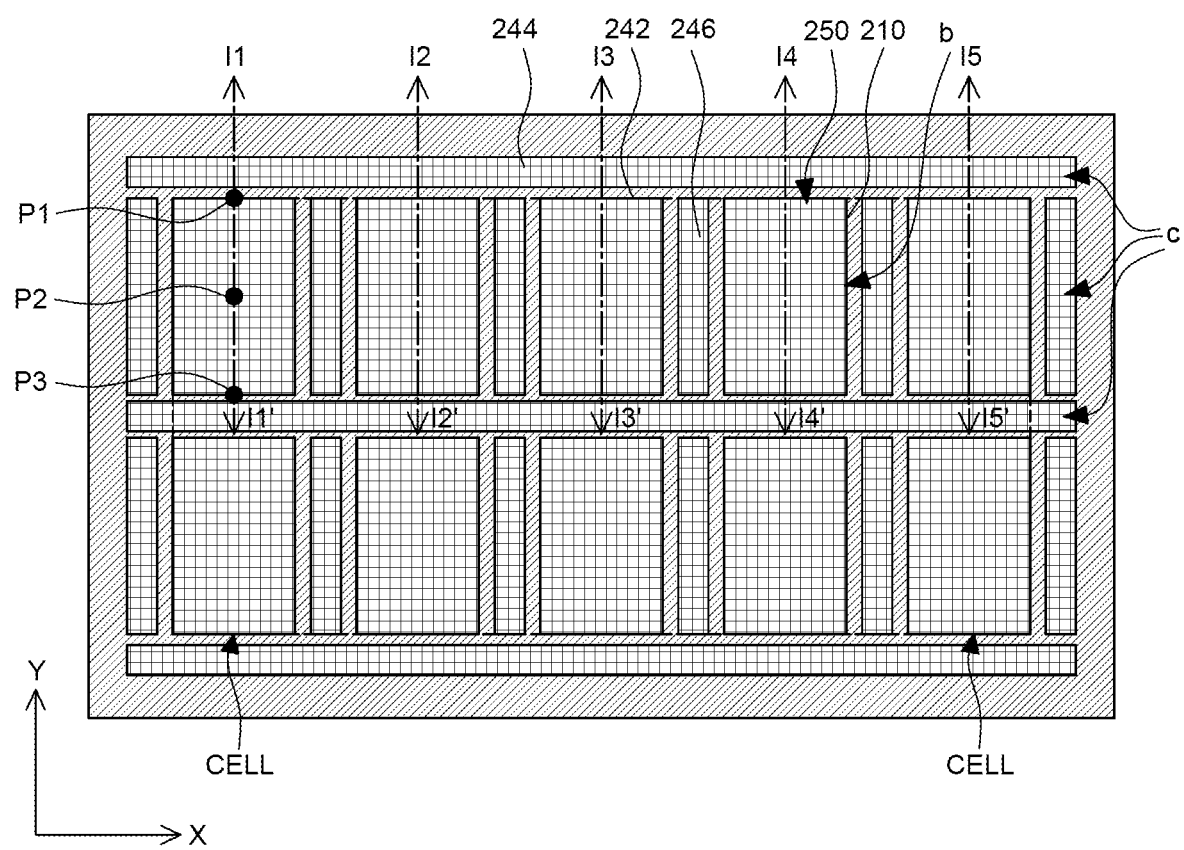

FIG. 9A shows the measured thickness of a plating layer taken along lines I1-I1', I2-I2', I3-I3', I4-I4' and I5-I5' in FIG. 9B when applied as shown in FIG. 5A through FIG. 5C.

With reference to FIG. 9A and FIG. 9B, the thickness of a plating layer was measured from three points in each of five cell regions. For example, the thickness of the plating layer was measured from three points in FIG. 9B, i.e., P1, P2, and P3. With reference to FIG. 9A, it can be seen that the plating layer in the cell region has a thickness difference of less than 7%. For example, it can be seen that the plating layer has a thickness difference of less than 7% between the central portion and the upper and lower portions of the pattern region. For example, the thickness difference of the plating layer is reduced by 8% or more compared to that of FIG. 4. Therefore, it may be shown that the thickness of the plating layer may be maintained uniformly by the auxiliary region. Thus, the thickness of the plating layer throughout the entire substrate may be maintained uniformly.

The thickness of the plating layer may be measured using a microscope, an X-ray fluorescence (XRF) analyzer, a focused ion beam (FIB)-scanning electron microscope (SEM), or the like. However, the present disclosure is not limited thereto. When the thickness of the plating layer is measured using a microscope, the length or thickness of the plating layer disposed on the substrate can be measured. If the substrate is formed of glass, it is easy to distinguish the conductive layer and the plating layer. Therefore, it is possible to measure the thickness of the plating layer using the microscope. The thickness of the plating layer can be measured using the microscope as shown in FIG. 3B and FIG. 3C. FIG. 3B and FIG. 3C illustrate, e.g., the vertical thickness of the plating layer formed on the conductive layer. However, the present disclosure is not limited thereto. For example, the horizontal thickness of the plating layer formed on the conductive layer can also be measured. The thickness of the plating layer in a non-pattern region is measured using an XRF analyzer. The thickness of the plating layer can be measured by inputting and reflecting an X-ray wavelength and detecting a change in wavelength at a point where materials are changed. An FIB-SEM measures the thickness of the plating layer by cutting a cross-section of the plating layer. Herein, the thickness of the plating layer was measured using the microscope and confirmed using the FIB-SEM.

Figure 10:
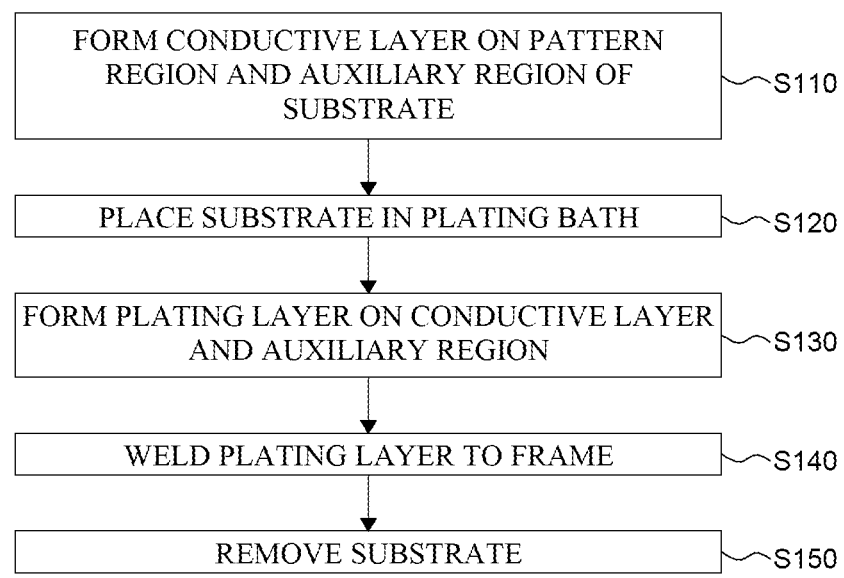
FIG. 10 is a flowchart for manufacturing a mask according to another embodiment of the present disclosure.

FIG. 10 is a flowchart for manufacturing a mask according to another embodiment of the present disclosure.

With reference to FIG. 10, a pattern region and an auxiliary region are formed on a substrate (S110). A conductive layer may be formed in the pattern region and the auxiliary region. The auxiliary region surrounds the pattern region. The auxiliary region may be formed by the method described above with reference to FIG. 6. Then, a substrate is disposed in a plating bath (S120). For example, the substrate including the conductive layer is disposed in the plating bath. Plating is performed to form a plating layer on the conductive layer in the pattern region and the auxiliary region (S130). Then, the plating layer is welded to a frame (S140). Then, the plating layer is separated from the substrate to manufacture a final mask (S150).

FIG. 11A through FIG. 11D illustrate a process for manufacturing a mask according to another embodiment of the present disclosure.

FIG. 11A through FIG. 11D illustrate a process for separating the plating layer from the substrate described above with reference to FIG. 10.

Figure 11A:
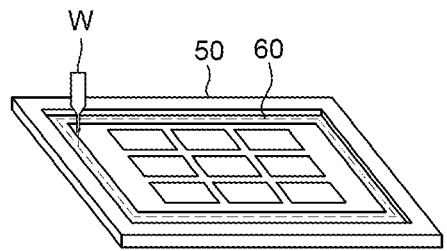
FIG. 11A through FIG. 11D illustrate a method of manufacturing a mask according to another embodiment of the present disclosure.

With reference to FIG. 11A, a frame 50 is welded to an open metal mask sheet 60. The frame 50 may be welded to the open metal mask sheet 60 using a laser W or the like. However, the present disclosure is not limited thereto. For example, the welding process may be performed using various kinds of fiber lasers including a neodymium-yttrium aluminum garnet (Nd-Yag) laser, but is not limited thereto. The second plating layer 244 and the third plating layer 246 of the substrate 210 may be covered with the open metal mask sheet 60. The open metal mask sheet 60 may be an open mask sheet, but is not limited to the term.

Figure 11B:
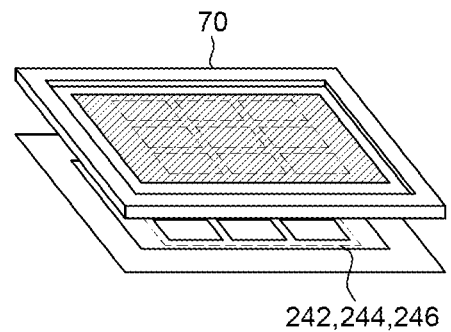

As shown in FIG. 11B, an open metal mask 70 prepared by welding the frame 50 to the open metal mask sheet 60, the first plating layer 242, the second plating layer 244, and the third plating layer 246 may be aligned. The aligning process may not be performed. The open metal mask 70 may be an open mask or frame, but is not limited to an open mask or frame. The first plating layer 242, the second plating layer 244, and the third plating layer 246 may be cut into a desired shape before being aligned with the open metal mask 70. The first plating layer 242, the second plating layer 244, and the third plating layer 246 may be formed in a desired region by the cutting process. After the cutting process, the first plating layer 242, the second plating layer 244, and the third plating layer 246 may be aligned with the open metal mask 70.

Figure 11C:
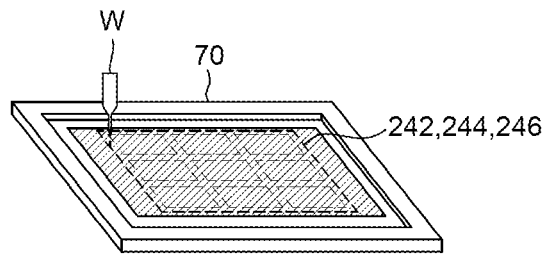

As shown in FIG. 11C, the first plating layer 242, the second plating layer 244, and the third plating layer 246 are welded to the open metal mask 70 using a laser W or the like. For example, the welding process may be performed using various kinds of fiber lasers including a neodymium-yttrium aluminum garnet (Nd-Yag) laser, but is not limited thereto. As another example, as described above with reference to FIG. 11B, after the cutting process, the first plating layer 242, the second plating layer 244, and the third plating layer 246 may be welded to the open metal mask 70 using a laser or the like.

Figure 11D:
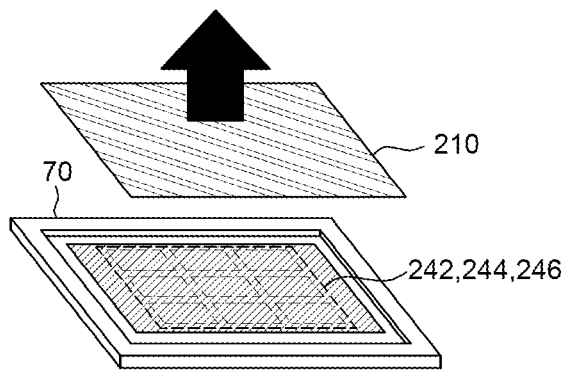

As shown in FIG. 11D, the substrate 210 may be reversed in a direction indicated by an arrow and then removed to manufacture a mask including the first plating layer 242, the second plating layer 244, and the third plating layer 246. As another example, the substrate may be removed without being reversed to manufacture a mask.

An FMM mask may be manufactured in the form of a plurality of divided sticks. These sticks may be extended to a small thickness and welded to a frame. For example, the FMM mask may be manufactured by separating a plating layer from a substrate and then extending and welding the plating layer. In this case, if a mask is thin, slip phenomenon occurs between adjacent sticks when the mask is extended. If the slip phenomenon occurs, a high-precision mask cannot be manufactured. Further, since the mask needs to be extended and welded, it takes 24 hours or more to manufacture a mask for scattering. Therefore, by performing an extension-free process by which a substrate and a frame are welded first and then the substrate is separated, it is possible to suppress the deformation of a mask caused by extension and reduce manufacturing time for an FMM mask. However, the present disclosure is not limited thereto. A mask can be manufactured in other ways.

As another example, the substrate 210, the first conductive layer 222, the second conductive layer 224, and the third conductive layer 226 may be separated from the first plating layer 242, the second plating layer 244, and the third plating layer 246. Then, the first plating layer 242, the second plating layer 244, and the third plating layer 246 may be welded to the frame 50. The first plating layer 242, the second plating layer 244, and the third plating layer 246 welded to the frame 50 may be used as a mask according to an embodiment of the present disclosure.

As another example, the substrate 210 including a plating layer may be welded to an open metal mask prepared by welding a frame to an open metal mask sheet. Then, the substrate 210 and a conductive layer may be separated from the plating layer. The plating layer may be used as a mask according to an embodiment of the present disclosure.

As another example, the first plating layer 242, the second plating layer 244, and the third plating layer 246 from which the first conductive layer 222, the second conductive layer 224, and the third conductive layer 226 have been separated before being welded to a frame may be used as a mask according to an embodiment of the present disclosure.

As another example, a substrate, the first plating layer 242, the second plating layer 244, and the third plating layer 246 may be welded to a frame and then the substrate is removed. The first plating layer 242, the second plating layer 244, and the third plating layer 246 welded to the frame may be used as the mask 200 according to another embodiment of the present disclosure.

The mask 200 according to an embodiment of the present disclosure may include a plating layer and the frame 50. After the substrate 210 and a conductive layer are separated from the plating layer, the separated plating layer may be welded to the frame 50. As another example, since it is difficult to weld the separated plating layer to the frame, an open mask may be welded to the frame and the welded open mask may be welded to the plating layer.

The frame 50 may be formed to a size suitable for the second plating layer 244 and/or the third plating layer 246 to be disposed thereon. In this case, the frame 50 may be combined with the first plating layer 242, the second plating layer 244, and the third plating layer 246 to support the first plating layer 242, the second plating layer 244, and the third plating layer 246. As another example, the frame 50 may be formed to a size greater than the size suitable for the second plating layer 244 and/or the third plating layer 246 to be disposed thereon. For example, the frame 50 may have a shape extended along the second plating layer 244 and/or the third plating layer 246 and may be disposed to be in contact with a part of the second plating layer 244 and/or the third plating layer 246.

The frame 50 may be welded to the first plating layer 242, the second plating layer 244, and the third plating layer 246 in a region for the second plating layer 244. As another example, the frame 50 may be welded to the first plating layer 242, the second plating layer 244, and the third plating layer 246 in regions for the second plating layer 244 and the third plating layer 246, respectively. The welding process may be performed using various kinds of fiber lasers including a neodymium-yttrium aluminum garnet (Nd-Yag) laser, but is not limited thereto.

Figure 12:
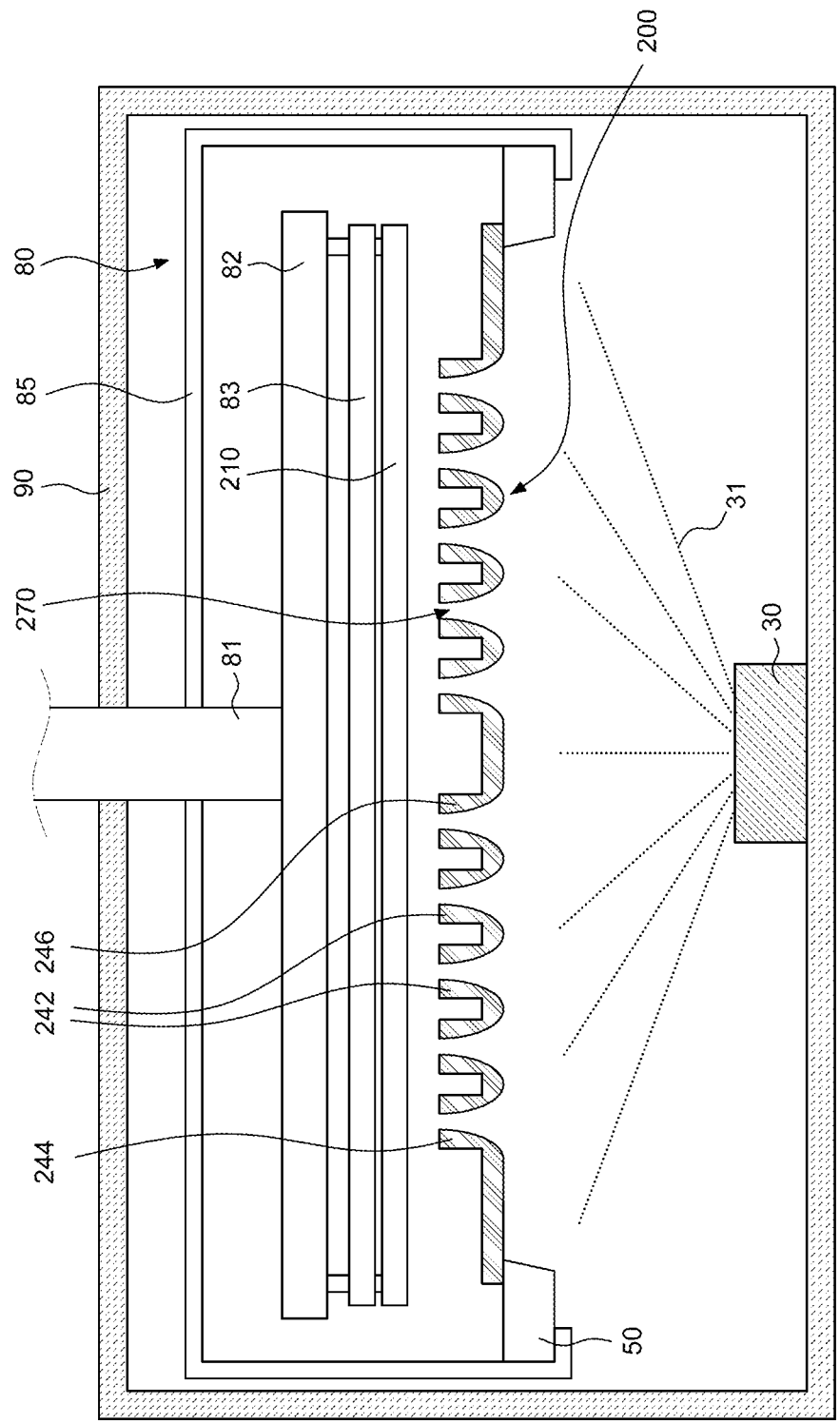
FIG. 12 illustrates a chamber where an organic material is sputtered on a display panel using the mask shown in FIG. 7C.

FIG. 12 illustrates a chamber where an organic material is sputtered on a display panel using the mask 200 shown in FIG. 7C.

As shown in FIG. 12, a sputtering unit 80 and a sputtering source 30 are disposed in a vacuum chamber 90. The sputtering source 30 is under the sputtering unit 80. The sputtering unit 80 supported by a supporting shaft 81 includes a support 85, the mask 200 disposed on the support 85, and the substrate 210 which is disposed above the mask 200 and on which an organic material is to be sputtered. The sputtering unit 80 further includes a cooling plate 83 disposed above the substrate 210 to cool heat generated during the sputtering process, and a magnet plate 82 disposed above the cooling plate 83 to suppress sagging of the mask 200.

A source 31 accommodated in the sputtering source 30 disposed on the bottom of the vacuum chamber 90 may be heated to be vaporized or sublimated. The source 31 vaporized or sublimated from the sputtering source 30 may be selectively sputtered on the substrate 210 through a plurality of openings 270 formed in the mask 200 disposed under the substrate 210.

An embodiment of the present disclosure will be described below.

According to an embodiment of the present disclosure, a method of manufacturing a mask comprises forming a conductive layer on a pattern region and an auxiliary region around the pattern region of a substrate, placing the substrate including the conductive layer in a plating bath, forming a plating layer on the conductive layer, and separating the substrate and the conductive layer from the plating layer.

According to example embodiments of the present disclosure, the conductive layer on the pattern region and the auxiliary region of the substrate may be formed of a metal material.

According to some embodiments of the present disclosure, the forming the conductive layer on the pattern region and the auxiliary region of the substrate may include forming the conductive layer with different widths on the auxiliary region.

According to some embodiments of the present disclosure, the separating the substrate and the conductive layer from the plating layer may include preparing an open mask by loading an open mask sheet onto a frame, welding the open mask to the substrate, and removing the substrate.

According to some embodiments of the present disclosure, the separating the substrate and the conductive layer from the plating layer may include welding a frame to the substrate and removing the substrate.

According to some embodiments of the present disclosure, the method may further comprise welding the plating layer to a frame after the separating the substrate and the conductive layer from the plating layer.

According to some embodiments of the present disclosure, the method may further comprise welding the plating layer to a frame before the separating the substrate and the conductive layer from the plating layer.

According to some embodiments of the present disclosure, the forming the plating layer on the conductive layer may include electroplating in which a current is applied to an anode and a cathode or a chemical plating in which a surface of the substrate is plated.

According to some embodiments of the present disclosure, the forming the plating layer on the conductive layer may include forming the plating layer having different widths in the auxiliary region in a direction from the plating layer to the cathode.

According to some embodiments of the present disclosure, the pattern region may include a plurality of cell regions, and the conductive layer in the plurality of cell regions may define a plurality of openings.

According to some embodiments of the present disclosure, the conductive layer in the auxiliary region may define a plurality of openings, and a width between the openings in the auxiliary region adjacent to a cathode on the substrate may be greater than a width between the openings in the auxiliary region distant from the cathode on the substrate.

According to some embodiments of the present disclosure, a width between the openings in the pattern region may be greater than the width between the openings in the auxiliary region distant from the cathode on the substrate and less than the width between the openings in the auxiliary region adjacent to the cathode on the substrate.

According to some embodiments of the present disclosure, the conductive layer may be formed by sputtering or rolling.

According to some embodiments of the present disclosure, the conductive layer may be formed of one of ITO on molybdenum (ITO/Mo), copper (Cu) on a molybdenum-titanium alloy (MoTi), and ITO on copper (ITO/Cu).

According to an embodiment of the present disclosure, a mask comprises a pattern region in a plurality of cell regions, the pattern region having a first plating layer, and an auxiliary region configured to be around the pattern region, of the auxiliary region having a second plating layer.

According to some embodiments of the present disclosure, the first plating layer may be in a central portion and a peripheral portion of the pattern region, and the auxiliary region is configured to have a thickness of the first plating layer in the central portion of the pattern region equal to that in the peripheral portion of the pattern region.

According to some embodiments of the present disclosure, a width of the first plating layer may be different from that of the second plating layer.

According to some embodiments of the present disclosure, the auxiliary region may be in a region except the pattern region.

According to some embodiments of the present disclosure, the first plating layer and the second plating layer may be formed of the same material.

According to an embodiment of the present disclosure, a mask comprises a substrate including a plurality of cell regions, a first plating layer in the plurality of cell regions, a second plating layer in an outer periphery of the plurality of cell regions and a third plating layer between the plurality of cell regions, wherein one of the second plating layer and the third plating layer has the same thickness as the first plating layer.

According to some embodiments of the present disclosure, the second plating layer and the third plating layer may be configured to have the same thickness of the first plating layer in the plurality of cell regions.

According to some embodiments of the present disclosure, one of the second plating layer and the third plating layer may be configured to have different widths to have the same thickness of the first plating layer in the plurality of cell regions.

According to some embodiments of the present disclosure, the first plating layer, the second plating layer, and the third plating layer may be formed of the same material.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing a mask, comprising:
   forming a conductive layer on a pattern region and an auxiliary region adjacent to the pattern region of a substrate;
   placing the substrate including the conductive layer in a plating bath;
   forming a plating layer on the conductive layer; and
   separating the substrate and the conductive layer from the plating layer,
   wherein the pattern region includes a plurality of cell regions and the conductive layer has a first plurality of openings in each of the plurality of cell regions.

2. The method of manufacturing the mask of claim 1, wherein the conductive layer on the pattern region and the auxiliary region of the substrate is formed of a metal material.

3. The method of manufacturing the mask of claim 1, wherein forming the conductive layer on the pattern region and the auxiliary region of the substrate includes forming the conductive layer having different widths on the auxiliary region.

4. The method of manufacturing the mask of claim 1, wherein separating the substrate and the conductive layer from the plating layer includes:
   preparing an open mask by loading an open mask sheet onto a frame;
   welding the open mask to the substrate; and
   removing the substrate.

5. The method of manufacturing the mask of claim 1, wherein separating the substrate and the conductive layer from the plating layer includes:
   welding a frame to the substrate; and
   removing the substrate.

6. The method of manufacturing the mask of claim 1, further comprising:
   welding the plating layer to a frame after separating the substrate and the conductive layer from the plating layer.

7. The method of manufacturing the mask of claim 1, further comprising:
   welding the plating layer to a frame before the separating the substrate and the conductive layer from the plating layer.

8. The method of manufacturing the mask of claim 1, wherein forming the plating layer on the conductive layer includes electroplating in which a current is applied to an anode and a cathode or a chemical plating in which a surface of the substrate is plated.

9. The method of manufacturing the mask of claim 7, wherein forming the plating layer on the conductive layer includes forming the plating layer having different widths in the auxiliary region in a direction extending from the plating layer to the cathode.

10. The method of manufacturing the mask of claim 1, wherein the conductive layer in the auxiliary region has a second plurality of openings, and a width between the openings in the auxiliary region adjacent to a cathode on the substrate is greater than a width between the openings in the auxiliary region distant from the cathode on the substrate.

11. The method of manufacturing the mask of claim 10, wherein a width between the openings in the pattern region is greater than the width between the openings in the auxiliary region distant from the cathode on the substrate and less than the width between the openings in the auxiliary region adjacent to the cathode on the substrate.

12. The method of manufacturing the mask of claim 1, wherein the conductive layer is formed by sputtering or rolling.

13. The method of manufacturing the mask of claim 1, wherein the conductive layer is formed of indium-tin-oxide (ITO) on molybdenum (ITO/Mo), copper (Cu) on a molybdenum-titanium alloy (MoTi), or ITO on copper (ITO/Cu).

14. A method of manufacturing a mask, comprising:
   forming a first conductive layer on a pattern region of a substrate;
   forming a second conductive layer on an auxiliary region, the auxiliary region being around the pattern region of the substrate;
   placing the substrate including the first and second conductive layers in a plating bath;
   forming a first plating layer on the conductive layer in the pattern region;
   forming a second plating layer on the auxiliary region in which the second plating layer has a different width than the first plating layer positioned on the pattern region; and
   separating the substrate, the first conductive layer and the second conductive layer from the first plating layer and the second plating layer,
   wherein the pattern region includes a plurality of cell regions, and the first conductive layer in the plurality of cell regions has a plurality of openings.

15. The method of manufacturing the mask of claim 14 further including:
   forming a third conductive layer between the plurality of cell regions; and
   forming a third plating layer between the plurality of cell regions, the third plating layer having a third width that is different from the first plating layer and the second plating layer.

16. The method of manufacturing the mask of claim 14 wherein:

the first and second conductive layers are formed at the same time, in the same steps.

17. The method of manufacturing the mask of claim 14 wherein:
the first and second plating layers are formed at the same time, in the same steps.

18. The method of manufacturing the mask of claim 15 wherein:
the first, second and third plating layers are formed at the same time, in the same steps.

* * * * *